(12) United States Patent
Scheffers et al.

(10) Patent No.: US 9,829,804 B1
(45) Date of Patent: Nov. 28, 2017

(54) SUBSTRATE HOLDING DEVICE, METHOD FOR MANUFACTURING SUCH A DEVICE, AND USE OF SUCH A DEVICE IN A LITHOGRAPHY SYSTEM

(71) Applicant: Mapper Lithography IP B.V., Delft (NL)

(72) Inventors: Paul Ijmert Scheffers, Delft (NL); Jerry Johannes Martinus Peijster, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 15/222,705

(22) Filed: Jul. 28, 2016

(51) Int. Cl.
*G03B 27/32* (2006.01)
*G03B 27/52* (2006.01)
*G03B 27/58* (2006.01)
*G03F 7/20* (2006.01)
*H01L 21/687* (2006.01)

(52) U.S. Cl.
CPC .......... *G03F 7/70716* (2013.01); *G03F 7/707* (2013.01); *G03F 7/70875* (2013.01); *H01L 21/6875* (2013.01)

(58) Field of Classification Search
CPC .. G03F 7/707; G03F 7/70716; G03F 7/70875; H01L 21/683; H01L 21/6875
USPC ......................................... 355/30, 72, 75, 77
See application file for complete search history.

(56) References Cited

U.S. PATENT DOCUMENTS

| | | | |
|---|---|---|---|
| 5,685,363 A | 11/1997 | Orihira et al. | |
| 7,528,349 B1 | 5/2009 | Gotkis et al. | |
| 2003/0228772 A1* | 12/2003 | Cowans | H01J 37/32724 438/795 |
| 2005/0128449 A1 | 6/2005 | Phillips | |
| 2008/0024743 A1 | 1/2008 | Kruit et al. | |

(Continued)

FOREIGN PATENT DOCUMENTS

| | | |
|---|---|---|
| JP | 2008311595 A | 12/2008 |
| JP | 2012231046 A | 3/2011 |

(Continued)

OTHER PUBLICATIONS

"Chen et al. Bringing Energy Efficiency to the Fab. McKinsey on semiconductors (Autumn 2013). pp. 52-55."

(Continued)

*Primary Examiner* — Colin Kreutzer
(74) *Attorney, Agent, or Firm* — Blakely Sokoloff Taylor & Zafman LLP

(57) ABSTRACT

The invention relates to a substrate holding device comprising a holding plate, a base plate, an array of supports, and an array of droplets of a heat absorbing material. The holding plate comprises a first side for holding a substrate. The base plate is arranged at a distance from the holding plate and provides a gap between the base plate and the holding plate at a side of the holding plate opposite to the first side. The array of supports is arranged in between the holding plate and the base plate. The array of liquid and/or solid droplets is arranged in between the holding plate and the base plate, and the droplets are arranged to contact both the base plate and the holding plate. The droplets are arranged spaced apart from each other and from the supports, and are arranged adjacent to each other in a direction along the gap.

31 Claims, 11 Drawing Sheets

(56) References Cited

U.S. PATENT DOCUMENTS

2014/0017613 A1    1/2014  Maehara
2014/0118709 A1*   5/2014  Morohashi .......... G03F 7/70875
                                                         355/30

FOREIGN PATENT DOCUMENTS

JP         2011066247 A    11/2012
WO    WO-2013171216 A1     11/2013

OTHER PUBLICATIONS

"Costa et al. Numerical Simulation of Solid-Liquid Phase Change Phenomena. Computer Methods in Applied Mechanics and Engineering (1991). pp. 1123-1134."
"Farid et al. A Review of on Phase Change Energy Storage: Materials and Applications. Energy Conversion and Management 45, 2004. pp. 1597-1615."
"Glassner. The Thermochemical Properties of Oxides, Fluorides, and Chlorides to 2500 K. US Atomic Energy Commission Report ANL 5750. 77 pages."
"Handbook of Chemistry & Physics. pp. D-56 and D-57 regarding "Thermodynamic Properties of Elements.""
"Himran et al. Characterization of Alkanes and Paraffin Waxes for Application as Phase Change Energy Storage Medium. Energy sources, vol. 16 (1994). pp. 117-128."
International Search Report in PCT/JP2017/028156 dated Oct. 3, 2017.

* cited by examiner

US 9,829,804 B1

SUBSTRATE HOLDING DEVICE, METHOD FOR MANUFACTURING SUCH A DEVICE, AND USE OF SUCH A DEVICE IN A LITHOGRAPHY SYSTEM

TECHNICAL FIELD

The invention relates to a substrate holding device, for example for use in a lithography system. The invention further relates to a method for manufacturing such a substrate holding device, and to a use of such a substrate holding device in a lithography system. The invention further relates to an apparatus for exposing a sample, in particular for processing or imaging a sample, more in particular a lithography apparatus. The invention further relates to a method for processing or imaging a sample.

BACKGROUND

In a lithography system, for example, photons or charged particles such as ions or electrons are used for illuminating and patterning the surface of a substrate such as a Silicon wafer. Due to the energy load of such photons or charged particles, the substrate is at least locally heated. In particular in a charged particle lithography system, such as a multi-beam charged particle lithography system, the impact of the charged particles may cause a significant heating of the substrate, in particular in conjunction with local impart of the charged particles on the substrate.

Various substrate holding devices have been proposed which suppress a temperature rise of the substrate, and thereby stabilizing the temperature of the exposed substrate.

Many of these holding devices rely on a thermal contact of the substrate with a coolant which is arranged to flow through the substrate holding device. One example of such a device is disclosed in U.S. Pat. No. 5,685,363, which describes a substrate holding device comprising a heat absorbing fluid chamber underneath a wafer or target to be exposed. This known substrate holding device comprises a heat absorbing fluid covered by a flexible sheet. In use, a substrate is pressed against the sheet by a substrate retainer, whereby the sheet, and thus the heat absorbing fluid, comes into intimate thermal contact with the rear face of the substrate to be stabilized in temperature.

Where, such as in a charged particle beam lithography system, the substrate is heated only locally, while the heat absorbing fluid extends underneath virtually along the entire rear face of the substrate, the layer of heat absorbing fluid in this known design, in addition to acting as a heat absorbent, acts as and forms a heat buffer.

In addition, the temperature stabilizing device as disclosed in U.S. Pat. No. 5,685,363 contains a heat absorbing fluid passage or coolant passage included in the stabilizing base, through which heat absorbing fluid flows in order to cool the substrate holding device, and to convey heat away from the substrate holding device. This allows to stabilize the temperature of the substrate holding device underneath the heat absorbing chamber and provides better control of the temperature at which the substrate holding device and the target are to be stabilized.

In lithographic exposure systems, often accommodated in a vacuum environment, such coolant passages are not preferred. One reason is that the associated coolant conduits hamper or disturb accurate positioning of the substrate, either directly or via hysteresis.

Within the field of lithography, patent publication US2005/0128449 teaches that a phase change material, so called PCM, can facilitate the removal of heat. A PCM can store a large amount of energy as latent heat during a phase change from a solid to a liquid. Advantageously, large quantities of thermal energy can be stored at a relatively constant temperature. Thus the use of a PCM can provide temperature stabilization by storing large amounts of thermal energy without significantly changing the temperature. PCM materials can be applied without coolant conduits while still securely controlling the temperature at which a target or substrate and substrate holding device are to be stabilized. Materials indicated for realizing such heat storing and stabilizing system comprise paraffin wax and Rubitherm™ PX. The PCM may be provided as a PCM powder or as a bound PCM.

This manner of combined heat storage and temperature control is based on a generally known principle utilizing phase change of a material at constant temperature. In applying this principle, as may further be known from a vast amount of literature, amongst which "A review of on phase change energy storage: materials and applications", by Mohamed M. Farid et al (Energy Conversion and Management 45, 2004), suitable materials may normally be selected from a handbook. In order to provide storage of large amounts of thermal energy at the desired temperature, a person skilled in the art will search for materials which possess a relatively high heat of transition or latent heat at the desired temperature, in casu the temperature of stabilization. One such handbook is the "Handbook of chemistry & Physics", which lists "thermodynamic properties of the elements" based on research published by the US Atomic Energy Commission, Report ANL-5750. Indicative of the popularity of certain materials amongst a large variety of PCMs is the selection of a paraffin (n-octadecane), gallium and tin for validating a numerical simulation of PCM behavior in "Numerical simulation of solid-liquid phase change phenomena" by Costa et al, 1991.

The patent publication US2008/0024743, in the name of the applicant, provides an example of a lithographic target exposure system showing such known temperature stabilization system, in which coolant conduits are omitted by the application of a PCM in the form of Hexadecane, for example. Hexadecane was selected for reason that its phase change temperature matches the upper end of a typical temperature range for coolant fluid used in semiconductor manufacturing, thereby preventing the temperature of the substrate heat buffer to deviate to an undesirable extent from other, normally liquid cooled parts of an industrial lithography system. In this respect the PCM temperature of Hexadecane may e.g. be taken to be about 291 K from "characterization of Alkanes and Paraffin Waxes for application as Phase Change Energy Storage Medium" by Himran and Suwono (Energy sources, vol. 16, 1994), while fab coolant liquid may be taken to be within a range from 286 to 291 K (55 to 65 F), from "Bringing energy efficiency to the fab" by Chen, Gautam and Weig (McKinsey on semiconductors, Autumn 2013).

While Hexadecane has the advantage of a phase change temperature matching an industrial operating temperature, at least an industrial coolant temperature, it appeared in practice to suffer from poor performance due to poor conductivity of heat, despite the use of measures to improve thermal conductivity between the target and the PCM as taught in this known, PCM based substrate temperature stabilization system.

Furthermore, U.S. Pat. No. 7,528,349 discloses a temperature stabilization system comprising a heat absorbing material disposed in thermal contact with a substrate. The heat absorbing material is characterized by a solid-liquid phase transition temperature that is in a desired temperature range for material processing the substrate. According to U.S. Pat. No. 7,528,349, the heat absorbing material may be provided as a flat layer dispose on top of a carrier, may be disposed to fill one or more depressions in the surface of the carrier or may be embedded in the carrier by filling recesses with the heat absorbing material. The heat absorbing material is arranged in direct contact with the substrate or with a suitable thermally conducting layer that is in sufficient thermal contact with both the substrate. Where, such as in a charged particle beam lithography system, the substrate is heated only locally, the resulting heat is absorbed locally by the heat absorbing material. Due to the absorption of heat, the heat absorbing material will at least partially undergo a phase transition substantially at the location where the charged particle beam impinges the substrate. This local phase transition results in a local expansion or contraction of the heat absorbing material. These local expansion or contraction produces undesired distortions or deformations of the substrate, which makes the temperature stabilizing system of U.S. Pat. No. 7,528,349 unsuitable for high resolution charged particle lithography.

The present invention hence seeks to provide a system, apparatus and/or method which provides means for an accurate temperature control of the system, apparatus and/or the substrate holding device by using a well heat conducting, generally a metallic phase change material, while still matching a temperature within the semiconductor standard range of coolant liquids. Standard metal materials have a phase change temperature remote from this desired operating range. Gallium, with a transition temperature of 303 K, is closest to the temperature range for coolant liquids used in the semiconductor manufacturing, but still deviates by 12 degrees. Other metallic-like materials may be selected from metallic based compound materials. Where such liquid metallic materials may exhibit a Gallium-like substance behavior, the present invention further seeks to optimize a PCM stabilized substrate support in its combined function as receptacle of such a liquid metallic compound and substrate temperature stabilizer, thereby providing a new design of such temperature stabilizing substrate support.

Equally, while the substrate holding device according to US 2008/0024743 provides a very compact and sophisticated manner for maintaining the substrate on top of the substrate holding device at a substantially constant temperature, it also proved to be difficult to manufacture such a substrate holding device and/or to obtain a carrier or heat conducting frame with highly accurate and reproducible dimensions suitable for use in a lithography system.

In addition or alternatively, it is an object of the invention to provide a design that is adapted to, at least deals with, the specific nature of metallic like phase change materials such as any of the various gallium compounds. It appears in practice that these materials tend to demonstrate an ice and water like behavior in their transition from solid to liquid, in that the volume in solid form often may be larger than in liquid form, causing poor thermal conductivity due to at least potential loss of direct contact between the upper layer of the holding device and the phase change material included underneath.

In addition or alternatively, it is an object of the present invention to provide an exposure method and apparatus therefor, which is provides an accurate temperature control of a substrate, in particular in an apparatus where an exposing unit for projecting electromagnetic radiation or particles onto said substrate, is arranged at such a close vicinity to said substrate that the exposing unit may thermally affect the substrate.

In addition or alternatively, it is an object of the present invention to provide a substrate holding device which at least partially obviates at least one of the above mentioned drawbacks of the substrate holding device of the prior art.

SUMMARY OF THE INVENTION

According to a first aspect, the present invention provides a substrate holding device comprising:

a holding plate, wherein the holding plate comprises a first side for holding a substrate, a base plate which is arranged at a distance from the holding plate and provides a gap between the base plate and the holding plate at a second side of the holding plate which faces away from the first side, an array of supports which are arranged at least in between the holding plate and the base plate, and an array of droplets of a heat absorbing material, which droplets are arranged in the gap between the holding plate and the base plate, wherein the droplets are arranged spaced apart from the supports and from other droplets of said array of droplets, and wherein the droplets are arranged to contact both the base plate and the holding plate.

The array of supports between the base plate and the holding plate defines the width of the gap between the base plate and the holding plate and provides a frame with highly accurate and reproducible dimensions. This novel design for containing droplets of a phase change material in a manner adapted to successful, at least optimal thermal conductance, at least for successful temperature stabilized heat buffering, smartly utilizes, at least adapts the container design to a material property, in casu that of surface tension and cohesive force that causes a portion of a liquid material to adopt a ball or droplet shape. Hence, rather than filling a PCM container, i.e. a cavity arranged for containing the PCM in a holding device, the substrate holding device of the present invention is arranged to receive and contain droplets of phase change material, in particular droplets which are spaced apart from the supports and from other droplets of said array of droplets. The holder is preferably provided with a plurality of well distributed, relatively small and/or shallow indentations or cavities each adapted for containing a droplet of PCM.

The droplets are arranged spaced apart from the supports and from other droplets of said array of droplets to enable an expansion of said droplets at least in a direction along the gap between the base plate and the holding plate. The droplets in the array of droplets are arranged with sufficient lateral space, such that the droplets laterally standing free, at least in a direction along the gap between de holding plate and the base plate. The substrate holding device according to this embodiment can be manufactured more easily, since the position or positioning of the droplets does not interfere with the position or positioning of the supports.

Preferably, the PCM exhibits more cohesion than adhesion with the surfaces of the holding plate and/or the base plate which are facing the gap. This enables to contain a droplet of PCM flattened within the gap, in particular in a indentation or cavity thereof, so that the flattened droplet may shrink or expand in accordance with the conditions, while maintaining optimal contact with the holding plate and the base plate, and therewith providing the desired function as a temperature stabilizing substrate holding device. The later function is in particular realized without the disadvantages as in the above described solutions.

Furthermore, the array of droplets, which are in a liquid phase, a solid phase, or a combination of liquid and solid phase, are arranged to bridge the gap between the holding plate and the base plate. Accordingly, the droplets are in contact with both the holding plate and the base plate. This can, inter alia, be arranged by a proper selection of the volume of the individual droplets and/or the width of the gap between the base plate and the holding plate. The contact between the holding plate and the droplets provides proper heat conduction from the holding plate to the droplets of heat absorbing material on the one hand, and the contact between the base plate and the droplets provides a proper heat conduction from the base plate to the droplets of heat absorbing material on the other hand.

When the whole gap between the base plate and the holding plate would be filled with the heat absorbing material, any expansion or contraction of the heat absorbing material due to an absorption of heat will result in an increase or decrease in the pressure in the heat absorbing material which may result in a change in the dimensions of the substrate holding device and/or a deformation of the holding plate. The present invention provides a solution to this problem, by using an array of droplets of heat absorbing material.

In an embodiment, the droplets are arranged to enable a substantial free expansion of said droplets in the direction along the gap between the base plate and the holding plate. The assembly of substantially individual droplets allows each droplet to expand or contract in the direction along the gap, substantially without providing an increase or decrease of pressure of said droplets on the holding plate or base plate.

In an embodiment, the array of supports is fixedly attached to the second side of the holding plate. By attaching the array of supports to the second side of the holding plate, the supports are arranged on a substantially fixed location of the holding plate. This allows to arranged the supports in a suitable pattern to provide a rigid support for the holding plate, which is substantially uniform over the area of said holding plate. In addition, this allows to provide a gap between the base plate and the holding plate having highly accurate and reproducible dimensions.

Alternatively or additionally, in an embodiment, the supports of said array of supports are fixedly attached to the base plate. In an embodiment, the base plate is provided with an array of holes, wherein each support of said array of supports extends at least partially into one hole of said array of holes, preferably wherein the supports are fixedly arranged in said holes by providing a glue connection in a circumferential gap between the hole and the support extending into said hole. By providing the glue in between the circumferential inner wall of the hole and the circumferential outer wall of the supports, any shrinking or expansion of the glue during the curing thereof gives rise to forces which act in a direction substantially perpendicular to the width of the gap between the base plate and the holding plate. Therefore, these forces substantially do not influence or alter the distance between the base plate and the holding plate, in particular during the curing or setting of the glue. The substrate holding device according to this embodiment can thus be manufactured with a high accuracy with regard to the width of the gap between the base plate and the holding plate, and also with regard to the total thickness of the substrate holding device, in particular the thickness in the direction perpendicular to the first side of the holding plate.

In an embodiment, said substrate holding device further comprises an array of rings which are arranged in the gap between the holding plate and the base plate and wherein each ring of said array of rings is arranged to surround one droplet of said array of droplets. Each of these rings can be used as a mold for a droplet of said array of droplets of a heat absorbing material, wherein a droplet is arranged inside a ring.

In an embodiment, a thickness of said rings is less than the width of the gap between the holding plate and the base plate. Preferably the dimensions and/or material of the rings is selected such that the thickness of said rings remains less than the width of the gap, irrespective of any expansion or contraction of the rings due to a change in temperature, in particular within a working temperature range of the substrate holding device. The rings are not in contact of both the base plate and the holding plate, and thus the rings do not exert a substantive force to the holding plate and the base plate. Accordingly, the rings do not have an effect on the width of the gap.

When using such rings as molds for the droplets, the droplets are in first instance also made thinner than the width of the gap between the holding plate and the base plate, and are then 'frozen' solid. These solid droplets of heat absorbing material can be easily handled and arranged in between the base plate and the holding plate during manufacturing of the substrate holding device. When the holding plate is arranged on top of the base plate, with the array of supports and the array of solid droplets in between, the droplets of heat absorbing material are melted to produce a liquid droplet that contacts both the base plate and the holding plate. In addition the droplets shrink in the direction along the gap, providing room to enable an expansion of said droplets in a direction along the gap between the base plate and the holding plate. Subsequently the droplets, which are in contact with both the base plate and the holding plate, are frozen again. These frozen droplets provide a means for absorbing heat from the holding plate and/or the base plate.

Preferably the droplets comprise a material having a high surface tension with respect to the surface of the holding plate and/or the base plate which faces the gap between the base plate and the holding plate. Using a heat absorbing material with a high surface tension favorably facilitates the contacting of both the base plate and the holding plate by the liquid droplets.

In addition or alternatively, the rings provide a means for fixing the location of the droplets in the gap between the base plate and the holding plate.

Preferably, the rings are made from a flexible or elastic material. The rings of such an embodiment also facilitate an expansion of said droplets in a direction along the gap between the base plate and the holding plate.

In an embodiment, the base plate and/or the holding plate is provided with an array of pockets, wherein the width of the gap between the holding plate and the base plate at a pocket of said array of pockets is larger than the width of the gap between the holding plate and the base plate around said pocket, and wherein each pocket of said array of pockets is arranged for holding one droplet of said array of droplets. It is noted that each pocket may also be provided as indentation or depression, in particular a shallow indentation or depression. The pockets are arranged in the surface of the base plate which faces the gap and/or the surface of the holding plate which faces the gap. Preferably the depth of said pockets is smaller than a height of said droplets. The pockets provide a means for fixing the location of the droplets in the gap between the base plate and the holding plate, in particular without the need of using rings.

Since no rings or other means are required to substantially fix the location of the droplets, the droplets can be arranged closer together, which provides a better coverage of the heat absorbing material over the area at the second side of the holding plate.

In an embodiment, at least one pocket of said array of pockets is substantially shaped as a cone, a conical frustum, a truncated sphere, or a spherical frustum. Preferably, the pocket is shaped such that the width of the gap at or near the circumferential edge of the pocket is smaller than the width of the gap at or near the center of the pocket. In this case, the shape of the pocket assists in keeping the droplets substantially on the desired location, in particular when the PCM exhibits more cohesion than adhesion with the surfaces of the holding plate and/or the base plate which are facing the gap.

In an embodiment, a surface of the base plate which faces the gap comprises an array of pockets, wherein each pocket of said array of pockets comprises an elastic member which spans said pocket and is arranged spaced apart from a bottom surface of said pocket, and wherein each pocket comprises a droplet from said array of droplets, wherein said droplet is arranged between said elastic member and the holding plate. The elastic member provides a means for taking up any residual expansion in the direction substantially perpendicular to the gap, by bending of the elastic member towards the bottom surface of the pocket. In addition, the elastic member can assist in pushing the droplets towards the cover plate to ensure and provide a stable contact between the droplets and the cover plate. Preferably the elasticity of the elastic member is selected such that the spring force provided by the bended elastic member does substantially not result in a local deformation of the holding plate.

In an embodiment, the distance between the elastic member and the holding plate is larger than the distance between the holding plate and the surface of the base plate adjacent to the pockets. Accordingly, the elastic member is arranged inside the corresponding pockets. On the one hand the elastic member is arranged spaced apart from the bottom surface of the pocket to allow the elastic member to bend towards the bottom surface of the pocket. On the other hand, the elastic member is arranged below the surface of the base plate surrounding the pocket, which provides a means for fixing the location of the droplets in the gap between the base plate and the holding plate.

In an embodiment, the elastic member comprises a cover, preferably a cover plate. Accordingly, the cover or cover plate covers the bottom surface of the pocket, and preferably separates the part of the pocket between the cover or cover plate and the bottom surface of the pocket, from the part of the pocket above the cover or cover plate. In an embodiment, the cover or cover plate is substantially flat. Such a flat cover or cover plate can easily be produced by cutting said cover or cover plate from a large piece of suitable material. In an alternative embodiment, the cover or cover plate is non-flat and is preferably shaped as a cone, a conical frustum, a truncated sphere, or a spherical frustum. Such a non-flat cover plate provides the same advantages as described above with reference to the cone shaped pockets in addition to the advantage of taking up any residual expansion in the direction substantially perpendicular to the gap, by bending of the cover or cover plate towards the bottom surface of the pocket. In an embodiment, the cover or cover plate is shaped as a cup with a circumferential flange which is placed to at least partially be in contact with the base plate for supporting the cup shaped cover or cover plate.

In an embodiment, each pocket comprises a support element for supporting at least part of an edge of said elastic member, preferably a circumferential edge of the cover or cover plate, in said pocket. Accordingly, the support element is arranged for supporting at least part of the edge of the elastic member, which allows the center part of the elastic member to bend towards the bottom surface of the pocket. Preferably, the droplet of PCM is substantially centrally arranged on top of the elastic member.

In an embodiment, the support element comprises a rim or a step arranged in a circumferential sidewall of said pocket. The rim or step, which preferably extend at the circumference around the pocket, can relatively easily be manufactured by first manufacturing a first pocket part with a first diameter to a first predetermined depth in the base plate, and subsequently manufacturing a second pocket part with a second diameter which is smaller than the first diameter to a second predetermined depth substantially centrally in the first pocket part. Alternatively, such a rim or step can be manufactured by first manufacturing a pocket part with the second diameter to a predetermined depth of the pocket, and subsequently inserting a rotating cutter in the first pocket part down to the level of the rim or step, and driving the rotating cutter circularly around the first pocket part and in outward direction up to the first diameter for milling the material of the base plate around the first pocket part away, while maintaining a constant level or depth. This yields a rim or step arranged at said predetermined depth. By using an elastic member with a diameter smaller than the first diameter, but larger than the second diameter, the edge of the elastic member rests on top of said rim or step.

In an embodiment, each pocket comprises a ring or a loop which is arranged in the gap between the holding plate and the elastic cover plate, and wherein the ring or the loop is arranged to surround a droplet in said pocket. The ring or loop is arranged in said pocket, preferably on top of said elastic cover plate, and acts as a confinement member for a droplet of PCM in said pocket.

In an embodiment, a thickness of said ring or loop is less than the distance between the holding plate and the elastic cover plate. Preferably the dimensions and/or material of the ring or loop is selected such that the thickness of said ring or loop remains less than the width between the elastic cover plate and the holding plate, irrespective of any expansion or contraction of the ring or loop due to a change in temperature, in particular within a working temperature range of the substrate holding device. The ring or loop is in contact with only one of the cover plate and the holding plate.

In an embodiment, the ring or loop is made from a flexible or elastic material. The ring or loop of such an embodiment also facilitates an expansion of a droplet of PCM inside said ring or loop, in particular in a direction along the gap between the base plate and the holding plate.

In an embodiment, the ring or loop comprises a substantially rectangular cross-section. In particular, the ring or loop comprises a rectangular cross-section in a direction substantially perpendicular the first side of the holding plate. Preferably, the ring or loop comprises a substantially flat upper surface, wherein the substantially flat upper surface is arranged facing the second side of the holding plate. This embodiment is particularly advantageous in case the density of the liquid PCM is higher than the density of the material of the ring or loop. In this case, the ring or loop will 'float' on the PCM material when it is in the liquid state, which will push the ring or loop towards the second side of the holding plate, and will allow the flat upper surface of the ring or loop to abut against the second side of the holding plate and to provide a confinement of the PCM.

In an embodiment, the base plate is provided with venting holes which debouche in a bottom surface of said pockets, and which preferably debouche substantially in the center of said pockets. Due to the venting holes, the pressure inside the part of the pockets between the bottom surface and the elastic cover plate is substantially not changed by the bending of the elastic cover plate.

In an embodiment for use in a substrate processing apparatus or substrate imaging apparatus, the droplets of said array of droplets comprises a material having a melting temperature or a melting range at or near a temperature of said substrate processing apparatus at least during processing of said substrate, or a temperature of said substrate imaging apparatus at least during imaging of said substrate. Preferably, the droplets of said array of droplets comprises a material having a melting temperature or a melting range at or near an operating temperature of an industrial coolant. Preferably, in use, the temperature of said substrate processing apparatus is close to or slightly above the operating temperature of the industrial coolant, which is preferably at or slightly below room temperature, preferably at or slightly below 18 degrees Celsius. Accordingly the machine parts of said substrate processing apparatus or substrate imaging apparatus do not need to be raised in temperature, and industrial coolant can easily be applied by or in an the substrate processing apparatus or substrate imaging apparatus which comprises the substrate holding device according to the invention.

In an embodiment, the gap comprises an open connection to the outside of the substrate holding device. The air pressure or vacuum pressure inside the gap is substantially equal to the air pressure or vacuum pressure outside the substrate holding device. In an embodiment the gap is substantially open at a surrounding side edge of the substrate holding device, preferably the gap is substantially open along substantially the complete surrounding side edge of the substrate holding device.

According to a second aspect, the present invention provides a substrate holding device comprising:

a holding plate, wherein the holding plate comprises a first side for holding a substrate, a base plate which is arranged at a distance from the holding plate and provides a gap between the base plate and the holding plate at a second side of the holding plate which faces away from the first side, an array of supports which are arranged at least in between the holding plate and the base plate, and an array droplets of a heat absorbing material, which droplets are arranged in between the holding plate and the base plate, wherein the droplets are confined by the holding plate and the base plate in a direction substantially perpendicular to the first side of the holding plate, and wherein the droplets are arranged to enable an expansion of said droplets at least in a direction along the gap between the base plate and the holding plate.

The array droplets, which preferably comprises liquid and/or solid droplets, is substantially confined between the holding plate and the base plate. Accordingly the droplets are in contact with both the holding plate and the base plate. This can, inter alia, be arranged by a proper selection of the volume of the individual droplets and/or the width of the gap between the base plate and the holding plate. The contact between the holding plate and the droplets provides proper heat conduction from the holding plate to the droplets of heat absorbing material on the one hand, and the contact between the base plate and the droplets provides proper heat conduction from the base plate to the droplets of heat absorbing material on the other hand.

According to a third aspect, the present invention provides an apparatus for processing or imaging a sample, wherein said apparatus comprises a source for electromagnetic radiation or particles having energy, an exposing unit for exposing said sample to said electromagnetic radiation or particles having energy, and a substrate holding device, or an embodiment thereof, as described above for holding said sample at least during said exposing.

In an embodiment, the exposing unit comprises a component for at least partially and/or temporally manipulating and/or blocking at least part of the electromagnetic radiation or charged particles, wherein the component is provided with conduits for guiding a cooling fluid through the conduits, wherein the conduits are arranged in thermal contact with the component. Accordingly, the cooling fluid in the conduits is arranged for removing heat which is generated by said partially and/or temporally manipulating and/or blocking of at least part of the electromagnetic radiation or charged particles by the component. Such a component comprises, for example, a diaphragm, an electrostatic beam deflector, or an electrostatic or magnetic lens system.

Usually the exposing unit is arranged at a side of the substrate facing away from the substrate holding device. When the exposing unit comprises one or more components for at least partially and/or temporally manipulating and/or blocking of at least part of the electromagnetic radiation or charged particles, said component is heated up in use. For example, when at least part of said electromagnetic radiation or charged particles impinge on the component. In addition to the heat generated by the electromagnetic radiation or charged particles which impinge in the substrate during an exposure, radiant heat from the one or more components of the exposure unit can further heat up the substrate, in particular when the one or more components are arranged close to the surface of the substrate. This additional heat from the exposing unit will also be absorbed by the heat absorbing material in the substrate holding device of the invention, which result in a more rapid depletion of the heat absorbing material, in particular when the heat absorbing material is a PCM. It is therefore advantageous to reduce the additional heat from the exposing unit as much as possible, and to combine the substrate holding device of the invention with an exposing unit with a cooling arrangement for cooling said at least one component of said exposing unit.

In an embodiment, the projection lens system is arranged for use in a multi-beam charged particle lithography system, wherein at least a first part of the conduits is arranged an area between two charged particle beams and wherein a central axis of said first part of the conduits extends in a direction substantially perpendicular to a central axis or optical axis of the exposing unit. Accordingly, the first part of the conduits are arranged close to the area where the charged particle beams, in use, travel through the projection lens system, which allows to remove any generated heat from this area efficiently.

In an embodiment, at least a second part of the conduits is arranged to extend so that a central axis of said second part of the conduits extend in a direction substantially parallel to a central axis or optical axis of the exposing unit. Accordingly, the first part of the conduits can be arranged at or near a first end of the exposing unit that, in use, is facing the substrate. The second part of the conduits provide an extension of the conduits away form said first end of the exposing unit, which allows to provide input and/or output connections for the fluid suitably spaced apart from the first end, and to arranged the first end of the exposing unit very close to the substrate. In an embodiment, said component comprises a projection lens system which is arranged at said first end of the exposing unit.

According to a fourth aspect, the present invention relates to a projection lens system for use in a an exposing unit for exposing a substrate with electromagnetic radiation or charged particles having energy, wherein the projection lens system comprises a component for at least partially and/or temporally manipulating and/or blocking at least part of the electromagnetic radiation or charged particles, wherein the component is provided with conduits for guiding a cooling fluid through the conduits, wherein the conduits are arranged in thermal contact with the component.

The projection lens system accordingly provides a temperature controlled exposing unit for use in a temperature stabilized lithographic system, for example. The projection lens is actively cooled to a temperature range well within that of ordinary fab temperature, in order to have the lithography system in a stable and internally conforming, i.e. balanced thermal state, thereby obviating complexity in apparatus design and saving energy on the one hand, and promoting optimal exposure conditions on the other hand, as required for ultimate accuracy in exposure and overly within contemporary lithography.

In an embodiment, the projection lens system is arranged for use in a multi-beam charged particle lithography system, wherein at least a first part of the conduits are arranged an area between two charged particle beams, wherein a central axis of said first part of the conduits extend in a direction substantially perpendicular to a central axis or optical axis of the projection lens system.

In an embodiment, at least a second part of the conduits are arranged to extend so that a central axis of said second part of the conduits extend in a direction substantially parallel to a central axis or optical axis of the projection lens system.

According to a fifth aspect, the present invention provides a method for manufacturing a substrate holding device comprising a holding plate, wherein the holding plate comprises a first side for holding a substrate, a base plate which is arranged at a distance from the holding plate and provides a gap between the base plate and the holding plate at a second side of the holding plate which faces away from the first side, an array of supports which are arranged at least in between the holding plate and the base plate, and an array of droplets of a heat absorbing material, wherein the method comprises the steps of:

arranging the droplets spaced apart from the supports and from other droplets of said array of droplets in between the holding plate and the base plate, wherein the droplets at least in their liquid phase are arranged to contact both the holding plate and the base plate, and/or wherein the droplets are confined by the holding plate and the base plate in a direction substantially perpendicular to the first side of the holding plate, and wherein the droplets are arranged to enable an expansion of said droplets in a direction along the gap between the base plate and the holding plate.

According to a sixth aspect, the present invention relates to a method for assembling a substrate holding device, wherein the method comprises the steps of:

providing a holding plate, wherein the holding plate comprises a first side for holding a substrate, and an array of supports which are fixed to a second side of said holding plate facing away from the first side, wherein the supports are arranged to extend substantially perpendicular to the second side;

providing a base plate comprising an array of holes for mounting the supports therein;

arranging an array of droplets of a heat absorbing material spaced apart from the supports and from other droplets of said array of droplets on the holding plate at a side facing the base plate, or on the base plate at a side facing the holding plate;

moving the holding plate with the supports and the base plate towards each other until a desired distance between the holding plate and the base plate has been reached, wherein the supports are positioned in the holes, and the array droplets are arranged in a gap between the holding plate and the base plate; and fixing one or more of said the supports in the corresponding hole.

In an embodiment, the supports are fixed to said second side via glue connections. In an embodiment, the one or more supports are fixed in the corresponding holes via a glue connection, which glue connection is provided in a circumferential gap between the hole and the support extending into said hole.

According to a seventh aspect, the present invention relates to a use of such a substrate holding device as described above in an apparatus for processing or imaging a sample, preferably a lithography system, more preferably a charged particle beam lithography system, such as a multi-beam charged particle lithography system.

In an embodiment, the apparatus for processing or imaging a sample comprises a source for electromagnetic radiation or particles having energy, and an exposing unit for exposing said sample to said electromagnetic radiation or charged particles having energy, wherein the exposing unit comprises a component for at least partially and/or temporally manipulating and/or blocking at least part of the electromagnetic radiation or charged particles, wherein the component is provided with conduits for guiding a cooling fluid through the conduits, wherein the conduits are arranged in thermal contact with the component.

According to an eighth aspect, the present invention provides an apparatus for exposing a sample, wherein said apparatus comprises a source for electromagnetic radiation or particles having energy, an exposing unit for exposing said sample to said electromagnetic radiation or particles, wherein the exposing unit comprises a component for at least partially and/or temporally manipulating and/or blocking at least part of the electromagnetic radiation or charged particles, wherein the component comprises a cooling arrangement which is arranged for substantially maintaining the component at a predetermined first temperature, and a substrate holding device for holding said sample at least during said exposing, wherein the substrate holding device comprises a temperature stabilizing arrangement which is arranged to substantially stabilize the temperature of a sample arranged on said substrate holding device, wherein the temperature stabilizing arrangement comprises a phase change material having a phase change at a second temperature, wherein the cooling arrangement and the temperature stabilizing arrangement are arranged such that the second temperature is at or near the first temperature.

According to the invention, both the substrate holding device and the exposing unit are each provided with an arrangement for controlling its temperature. In particular, since the exposing unit is arranged to expose a sample using electromagnetic radiation or particles having energy, the exposing unit and/or the sample will absorb at least part of the energy and would raise in temperature of the exposing unit and/or the sample on the substrate holding device. By providing both the exposing unit and the substrate holding device with their own cooling arrangement and temperature stabilizing arrangement, an accurate temperature control of the substrate can be obtained, which temperature control allows to at least substantially maintain the temperature of the substrate at the second temperature during an exposure of said substrate by said electromagnetic radiation or particles.

The present invention sets forth a concept for defining an exposure process and apparatus therefor, which is adapted to limitation of a practical environment. In particular, in an apparatus where an exposing unit for projecting electromagnetic radiation or particles onto said substrate is arranged at close vicinity to said substrate, the temperature of the exposing unit may thermally affect the substrate. By controlling the temperature of the exposing unit, for example using a cooling arrangement, a negative effect of the temperature of the exposing unit on the substrate can be substantially prevented.

It is further considered, that for attaining such a method or process in a most economic manner, any such conditioning should thereto remain with minimal effort. On the one hand, in an economic exposing apparatus or method, the operating temperature should not be at a level at which in fact the entire surrounding of the wafer carrier should be maintained at an elevated temperature of 29.8° C., as would be the case with the suggested use of Gallium. The melting temperature of the phase change material used in the substrate holding device should be at considerable lower level.

On the other hand, the operating temperature should not be substantially higher than 18° C. for reason that in such manner standard Fabrication Plant (Fab) coolant may be used in the process, either directly or only with modest conditioning, when applying a further consideration as integrated in the present invention, according to which coolant should be at a lower, in view of a required ability to cool, preferably only slightly lower temperature than the operating temperature, at least a temperature maintained at the target during exposure. Considering that a Fab coolant generally ranges from 12 up to 18° C., and that Fab ambient temperature, deviation of which should be minimal, may often be room temperature, i.e. no more than 25° C., preferably no more than 22° C., the Phase Change Material melting temperature, which is equal to the second temperature, in accordance with an embodiment of the present invention is to be defined, and materials therefor to be elected, in accordance with target exposing process is defined with an operating temperature higher than Fab coolant temperature of 18° C., preferably higher than 18.5° C., and lower than maximum room temperature of 25° C., preferably lower that 22.5° C.

It is noted that the operating temperature as referred to in this application is the temperature of the apparatus for exposing a sample, during operation.

In an embodiment, the cooling arrangement and the temperature stabilizing arrangement are arranged such that a difference between the first temperature and the second temperature is not more than 4° C., preferably not more than 2° C. This provides a substantially thermally stable environment for the sample. By actively controlling cooling arrangement and by carefully selecting the right phase change material, the component of the exposure unit and the substrate holding device are arranged to substantially maintain said first and second temperatures respectively, and thus maintain said thermally stable environment during the exposure of the sample.

In an embodiment, the first temperature is lower than the second temperature. Accordingly, in use, the temperature of the exposing unit, at least the component thereof, is lower than the temperature of the substrate holding device and the temperature of a sample on top of said holding device. This measure substantially prevents any heating up of the sample by the component of the exposing unit, even when the component of exposing unit for projecting electromagnetic radiation or particles onto said substrate, is arranged at close vicinity to the sample.

In a preferred embodiment, the first temperature is substantially equal to the second temperature. In an embodiment, the first temperature and the second temperature are substantially equal to room temperature, in particular to room temperature in a Fabrication Plant (Fab).

In an embodiment, the phase change material comprises a metal, an alloy, or a metal based material. In a preferred embodiment, the phase change material comprises an Eutectic metal alloy. A metal based phase change material provides a high thermal conductivity both in the solid and liquid phase, which ensures that heat generated by the exposure of the sample is guided to and absorbed by the phase change material even when a considerable part of said phase change material has already been liquefied.

In an embodiment, the cooling arrangement comprises conduits for guiding a cooling fluid through the conduits, wherein the conduits are arranged in thermal contact with the component. Accordingly, standard Fabrication Plant (Fab) coolant, such as cooling water, may be used for cooling at least the component of the exposure unit.

In an embodiment, the cooling arrangement is arranged such that a difference between a temperature of the cooling fluid and the second temperature is not more than 4° C., preferably not more than 2° C. In an embodiment, the cooling arrangement comprises a temperature control system which is arranged the control the temperature of the cooling fluid with respect to the temperature of the substrate holding device. In an embodiment, the apparatus comprises temperature sensors for measuring the temperature of the substrate holding device and/or the temperature of the exposing unit, in particular the part of the exposing unit which is arranged adjacent the substrate holding device. In an embodiment, the cooling arrangement comprising a cooling device for cooling the cooling fluid to a temperature below the first temperature, and a heating device for heating the cooling fluid, wherein the heating device is arranged in the conduits at an upstream position with respect to the component. In particular the combination of temperature sensors for measuring the temperature of the part of the exposing unit which faces the substrate holding device, the combined cooling device and heating device for accurately controlling the temperature of the cooling fluid, and the temperature control system for controlling the temperature of the cooling fluid based on the signal from the temperature sensors, allows to control the temperature of the exposing device with high precision and to regulate the temperature difference between the substrate holding device and the exposing unit, in particular the part of said exposing unit which faces the substrate holding device, to be less than 4° C., preferably less than 2° C., more preferably less than 1° C.

In an embodiment, the component comprises a projection lens for projecting the electromagnetic radiation or particles onto the sample. In an embodiment wherein the cooling arrangement comprises conduits for guiding a cooling fluid through the conduits and wherein the conduits are arranged in thermal contact with the component, the conduits are arranged for transporting the cooling fluid through or around the projection lens. In particular in a projection lens for charged particle, the lens effect is established by magnetic and/or electrostatic field which need to be generated. In use, magnets and/or electrostatic lenses also generate an amount of heat which can be removed using the cooling arrangement according to this embodiment.

In an embodiment, the component comprises a modulation device for modulating the electromagnetic radiation or particles. In an embodiment wherein the cooling arrangement comprises conduits for guiding a cooling fluid through the conduits and wherein the conduits are arranged in thermal contact with the component, the conduits are arranged for transporting the cooling fluid through or around the modulation device. In use, a modulation device also generates an amount of heat which can be removed using the cooling arrangement according to this embodiment.

In an embodiment, the modulation device comprises a beam blanking assembly comprising a beam deflector for deflecting a beam of electromagnetic radiation or particles and a beam stop for blocking said beam of electromagnetic radiation or particles, wherein the conduits are arranged for transporting the cooling fluid through or around the beam stop. When a beam of electromagnetic radiation or particles are directed to the beam stop, the electromagnetic radiation or particles are to a large extend absorbed by the beam stop. In use, the absorption of the electromagnetic radiation of particles also generate an amount of heat in the beam stop, which can be removed using the cooling arrangement according to this embodiment.

In an embodiment, the source is a source for charged particles and the exposing unit comprises a charged particle optical system for projecting one or more charged particle beams onto said sample. In an embodiment, the source is arranged to provide multiple charged particle beams and wherein the charged particle optical system is arranged for projecting one or more of said multiple charged particle beams onto said sample, wherein at least a first part of the conduits is arranged in an area between two charged particle beams.

In an embodiment, the exposing unit comprises one or more temperature sensors, preferably wherein one of said one or more temperature sensor is arranged at a side of said exposing unit which faces the substrate holding device.

According to a ninth aspect, the invention provides a method for processing or imaging a sample using an apparatus or an embodiment as described above, wherein a conditioning of the temperature stabilizing arrangement is performed prior to the processing or imaging of the sample, wherein the conditioning comprises the step of solidifying at least part of the phase change material of said temperature stabilizing arrangement. When the phase change material absorbs heat, part of the phase change material liquefies or melts; the phase of the phase change material changes from solid to liquid. This absorbed heat can be removed from the phase change material in a condition process in which the heat change material is made to solidify or freeze; the phase of the phase change material is made to change back from liquid to solid. After such conditioning, the solid phase change material can be used again to absorb heat.

In an embodiment, the conditioning further comprises the step of setting the temperature of the temperature stabilizing arrangement at the second temperature prior to the processing or imaging of the sample. The second temperature is the melting temperature of the phase change material, thus the temperature where the phase of the phase change material changes from solid to liquid. The phase change material will be at this second temperature when both the solid and liquid phase of the phase change material are present and in thermal equilibrium. Accordingly, to ensure that at least a small amount of the phase change material is in the liquid phase and the majority of the phase change material is in the solid phase, the temperature stabilizing arrangement is at the second temperature, and ready to absorb any heat induced by the exposure process.

In an embodiment, the heating device and/or the cooling device are controlled to establish a temperature difference between the substrate holding device and the exposing unit, in particular the part of said exposing unit which faces the substrate holding device, which is less than 4° C., preferably less than 2° C., more preferably less than 1° C.

In an embodiment, a temperature of the apparatus during operation is in a temperature range from 19° C. to ° C., preferably wherein the first temperature and the second temperature are also arranged in the temperature range from 19° C. to 22° C.

According to a tenth aspect, the invention provides a use of an apparatus or an embodiment as described above for processing or imaging a sample.

The embodiments mentioned above with respect to the first aspect, can also suitably be applied in the inventions according to the other aspects.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
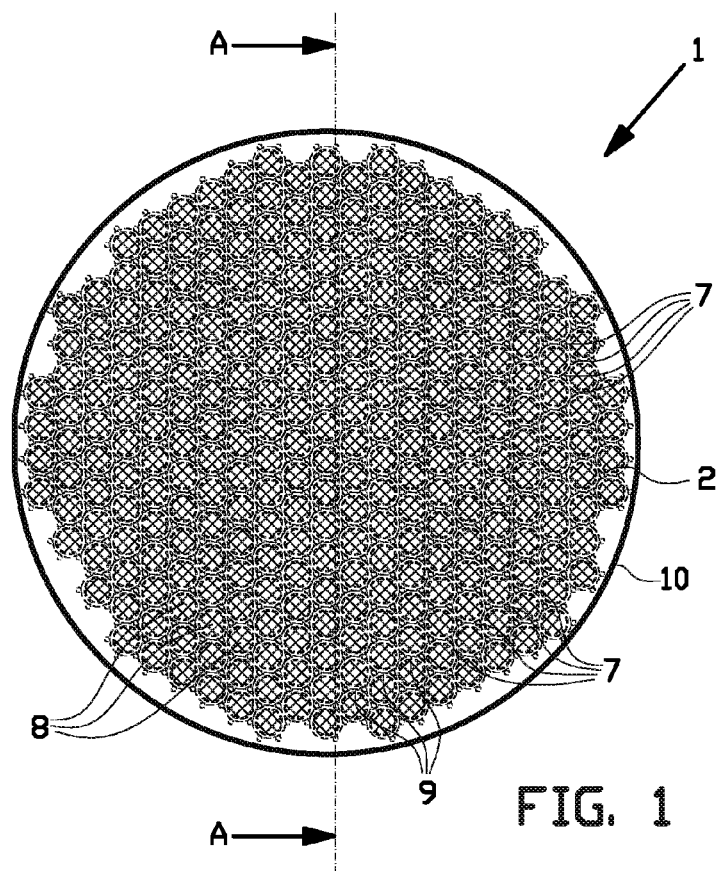
FIG. 1 is a schematic top view of a substrate holding device.
Figure 2:
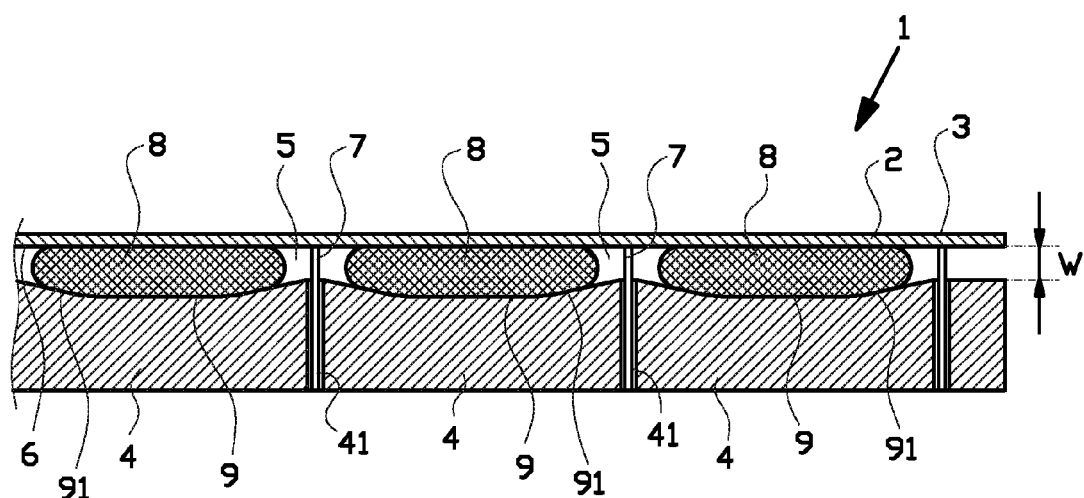
FIG. 2 is a schematic partial cross section along the line A-A in FIG. 1.

FIG. 1 shows a top view of a first example of a substrate holding device according to the present invention, and FIG. 2 shows a partial cross section of the first example along the line A-A in FIG. 1. The substrate holding device 1 comprises a holding plate 2 having a first side 3 for holding a substrate (not shown). The substrate holding device 1 further comprises a base plate 4 which is arranged at a distance from the holding plate 2 and at a second side 6 of said holding plate 2 which faces away from the first side 3. In between the base plate 4 and the holding plate 2, a gap 5 is provided which extends in a direction substantially parallel to the first side 3 of the holding plate 2. An array of supports 7 is arranged in between the holding plate 2 and the base plate 4, which define the distance between the holding plate 2 and the base plate 4, and thus define the width w of the gap 5. The holding plate 2, the base plate 4 and the supports 7 provide a frame for providing a heat absorbing material in the gap 5, which in use is arranged for removing heat from a substrate arranged on the first side 3 of the substrate holding device 1.

The holding plate 2 comprises, for example, a Si plate. The base plate 4 comprises, for example, a plate of Si-Carbide which has a coefficient of expansion which is substantially the same as the coefficient of expansion of Si. In addition, Si-Carbide is substantially inert and allows using a large range of heat absorbing materials. Furthermore, Si-Carbide has a high thermal conductivity which allows cooling the substrate holding device 1 via the base plate 4, and provides a substantial constant temperature along the base plate 4.

The supports 7 comprise, for example, Titanium supports, which are non-magnetic. Non-magnetic supports are advantageous when using the substrate holding device 1 in a charged particle processing or imaging apparatus. Although the supports 7 may be clamped between the holding plate 2 and the base plate 4, it is preferred that the supports 7 are fixedly attached to the second side 6 of the holding plate 2 and/or to the base plate 4, as will be explained in more detail below with reference to FIGS. 2, 3A, 3B and 3C.

According to the present invention, an array droplets 8 of a heat absorbing material are arranged in between the holding plate 2 and the base plate 4. The liquid and/or solid droplets 8 are arranged to bridge the gap 5 between the base plate 4 and the holding plate 2; thus the droplets 8 are arranged to contact both the base plate 4 and the holding plate 2. The droplets 8 are arranged spaced apart from each other, are arranged adjacent to each other in a direction along the gap 5, and are arranged substantially spaced apart from the supports 7. The droplets 8 are confined by the holding plate 2 and the base plate 4 in a direction substantially perpendicular to the first side 3 of the holding plate 2. In addition, the droplets 8 are arranged to enable an expansion of said droplets 8 in a direction along the gap 5 between the base plate 4 and the holding plate 2. As schematically shown in FIG. 2, the droplets 8 are arranged in (thermal) contact with the holding plate 2 and the base plate 4. Preferably the droplets 8 comprise a material having a melting temperature or a melting range at or near a temperature of a substrate processing apparatus at least during processing of said substrate, or at or near a temperature of a substrate imaging apparatus at least during imaging of said substrate. Heat removal is provided by the use of a phase transition, in particular the melting, of the droplets 8. Since the droplets 8 are arranged to enable expansion of said droplets 8 in a direction along the gap 5, contraction or expansion of the droplets 8 when going from solid to liquid and vice versa has substantially no effect on the dimensions of the assembly comprising said holding plate 2, said base plate 4 and the supports 7.

The heat absorbing material is preferably arranged in an array of flat droplets 7 with a diameter of approximately 15 mm and a thickness of approximately 0.8 mm. Using droplets 7 with a diameter of approximately 15 mm allows to provide an array of supports 7 in between said droplets, which supports 7 are arranged close enough to each other to provide a highly flat first side 3 of the holding plate 2. In this particular example, the supports 7 are arranged in order to provide a gap 5 with a width w of approximately 0.8 mm.

In this first example, the base plate 4 is provided with an array of pockets 9, which are arranged as shallow indentations or cavities in the surface of the base plate 4 facing the gap 5. The pockets 9 of this first example are substantially shaped as a conical frustum. For example, the descending slope 91 of said cone may be approximately 15 degrees, and at the center of the pockets 9 a substantially flat area is arranged. The droplets 8 are arranged to contact both the base plate 4 and the holding plate 23. The cone shaped edges 91 of the pockets 9 will substantially fix the position of the droplets 8 of heat absorbing material. In addition the cone shaped edges 91 of the pockets 9 and the surface tension in the liquid phase of the droplets 8 provides a positioning force to keep the liquid droplets 8 substantially in the pockets 9. No other parts are required to fix the location of the droplets 8. This allows to arrange the droplets 8 in the substrate holding device 1 of this first example more close to each other, which provides a suitable coverage of the area of the base plate 4 and the holding plate 2 with heat absorbing material. Due to the substantially flat area in the center of the pockets 9, the pockets 9 in the substrate holding device 1 of the first example are shallow which reduces the required amount of heat absorbing material.

As shown in FIG. 2, the base plate 4 is provided with an array of holes 41 and a first end of each support 7 of a series of supports is arranged in one of said holes 41 and is fixed in said hole 41 via a glue connection. A second end of each support 7, opposite said first end, is fixed to the holding plate 2 by means of a glue connection.

Figure 3A:
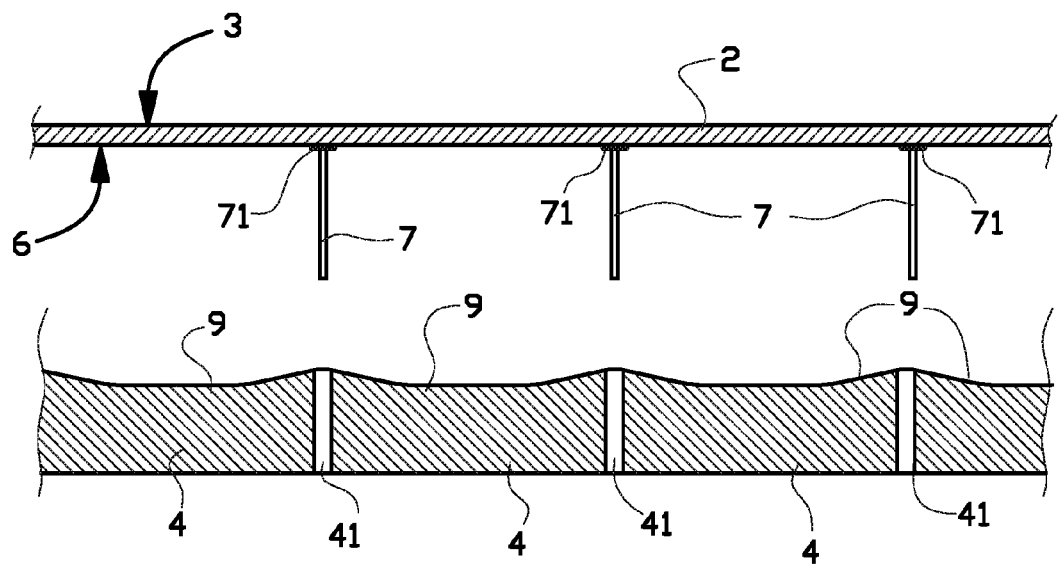
FIGS. 3A, 3B and 3C schematically show steps of a method for manufacturing a substrate holding device.
Figure 3B:
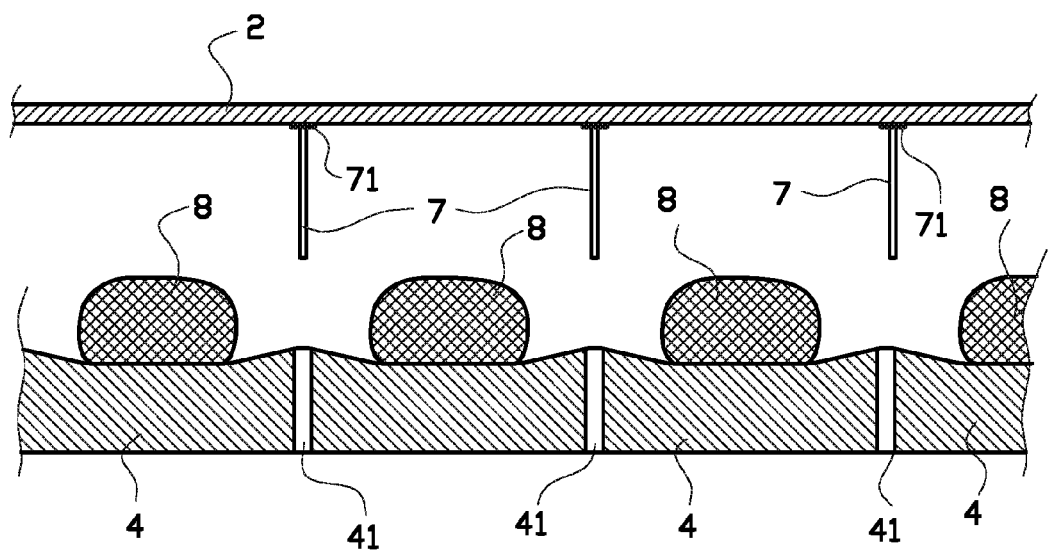
Figure 3C:
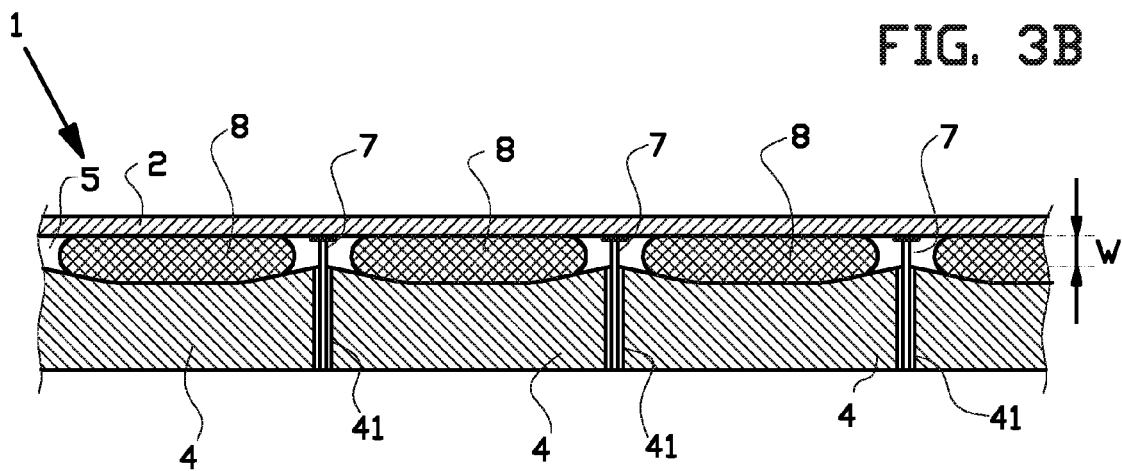

FIGS. 3A, 3B and 3C schematically show steps of a method for assembling a substrate holding device 1, in particular for assembling a substrate holding device according to the embodiment of FIG. 2. But also the substrate holding device according to the embodiments as described below with reference to FIGS. 4A, 4B, 5, 7 and 10 can be assembled in this way.

First, as shown in FIG. 3A, a base plate 4 is provided, which comprises an array of pockets 9. Adjacent to these pockets 9, holes 41 are provided for mounting the supports 7 therein. In addition a holding plate 2 is provided with a series of supports 7, which are fixed to the second side 6 of said holding plate 2 facing away from the first side 3 for, at least in use, holding a substrate. The supports 7 are arranged to extend substantially perpendicular to the second side 6, and are fixed to said second side 6 via glue connections 71.

Subsequently, droplets 8 of liquid heat absorbing material are arranged in the pockets 9, as schematically shown in FIG. 3B. In each pocket 9 of substantially the same size, substantially the same volume of heat absorbing material is dispensed. Preferably the heat absorbing material exhibits more cohesion than adhesion with the surfaces of the holding plate 2 and/or the base plate 2 which are facing the gap 5. Due to the surface tension, the liquid droplets 8 assume a, more or less, spherical shape.

Next, the holding plate 2 with the supports 7 is moved towards the base plate 4, and the supports 7 are positioned in the holes 41. The holding plate 2 is moved downwards until the desired distance w between the holding plate 2 and the base plate 4 has been reached. In this position, the droplets 8 are flattened in between the base plate 4 and the holding plate 2 as shown in FIG. 3C. De surface tension of the heat absorbing material provides and maintains that the droplets 8 contact both the holding plate 2 and the base plate 4.

Subsequently, one or more of said the supports 7 are fixed in the corresponding hole 41 via a glue connection, which glue connection is provided in a circumferential gap between the hole 41 and the support 7 extending into said hole 41.

Before use, the assembled substrate holding device 1 is arranged in a 'cold' environment, at a temperature below the freezing temperature of the heat absorbing phase change material, and the liquid droplets 8 will solidify, substantially in the shape as shown in FIG. 3C. Thus the solid droplets 8 bridge the gap 5 between the base plate 4 and the holding plate 2. Now the substrate holding device 1 is ready for use.

Figure 4A:
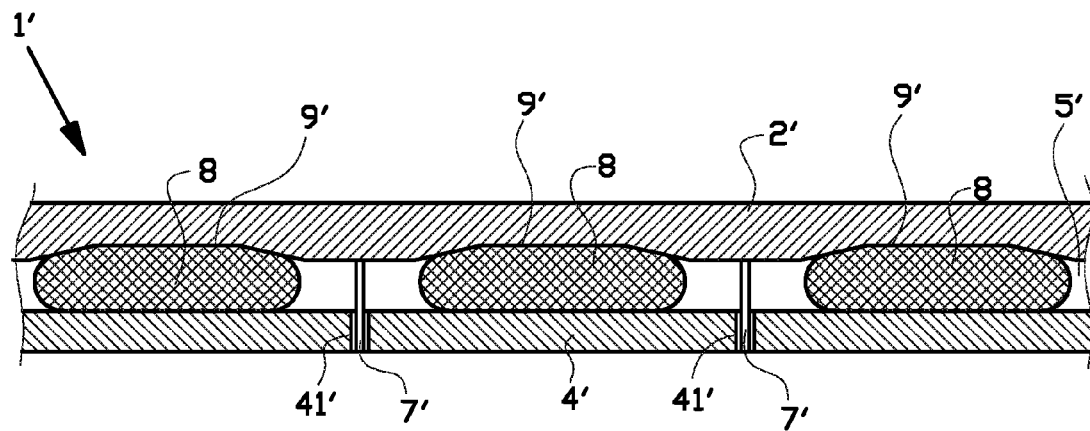
FIGS. 4A and 4B are schematic partial cross sections of a second and a third exemplary embodiment of a substrate holding device.

In the previous first example, the pockets 9 for holding the solid and/or liquid droplets 8 are arranged in the base plate 4, as described above. However, in a second example of the substrate holding device 1', the pockets 9' are arranged in de holding plate 2', in combination with a baseplate 4' with a substantially flat surface facing the gap 5', as schematically shown in FIG. 4A.

Figure 4B:
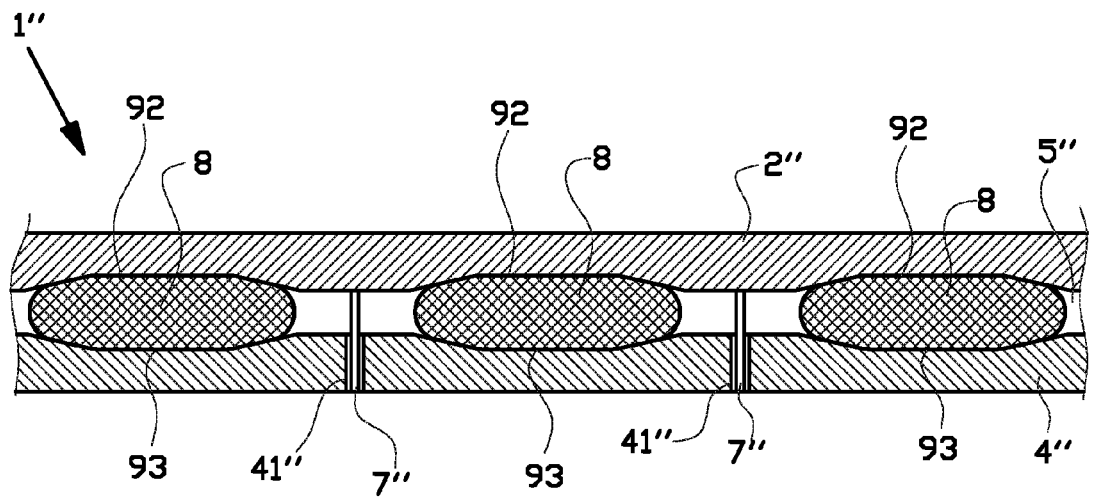

Alternatively, in a third example of the substrate holding device 1", both the surface of the baseplate 4" and the holding plate 2" facing the gap 5" are provided with pockets 92, 93, as schematically shown in FIG. 4B. In this embodiment, the indentations or cavities in the surface of the base plate 4" and the holding plate 2" facing the gap 5" which form the pockets 92, 93 can be more shallow and less deep, compared to the pockets 9, 9' of substrate holding device 1, 1' according to the first and second example.

Figure 5:
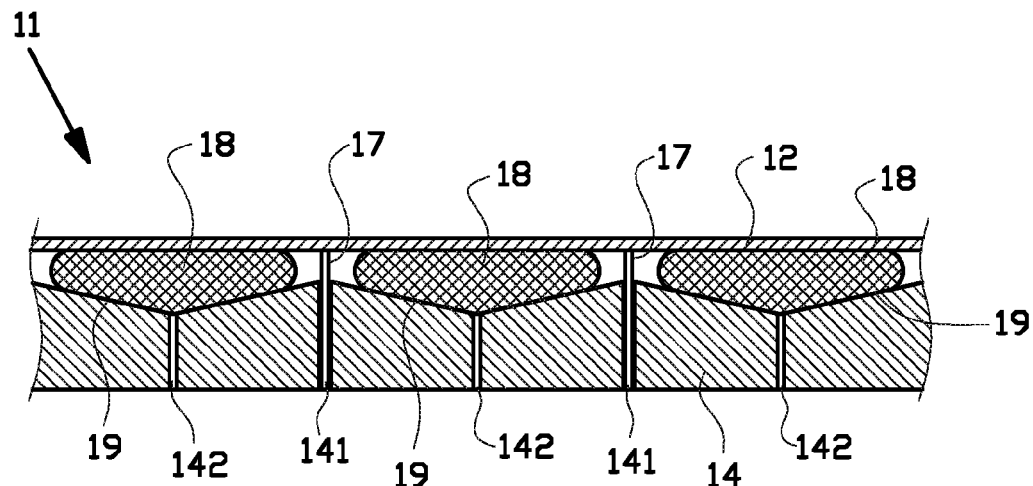
FIG. 5 is a schematic partial cross section of a fourth exemplary embodiment of a substrate holding device.
Figure 6:
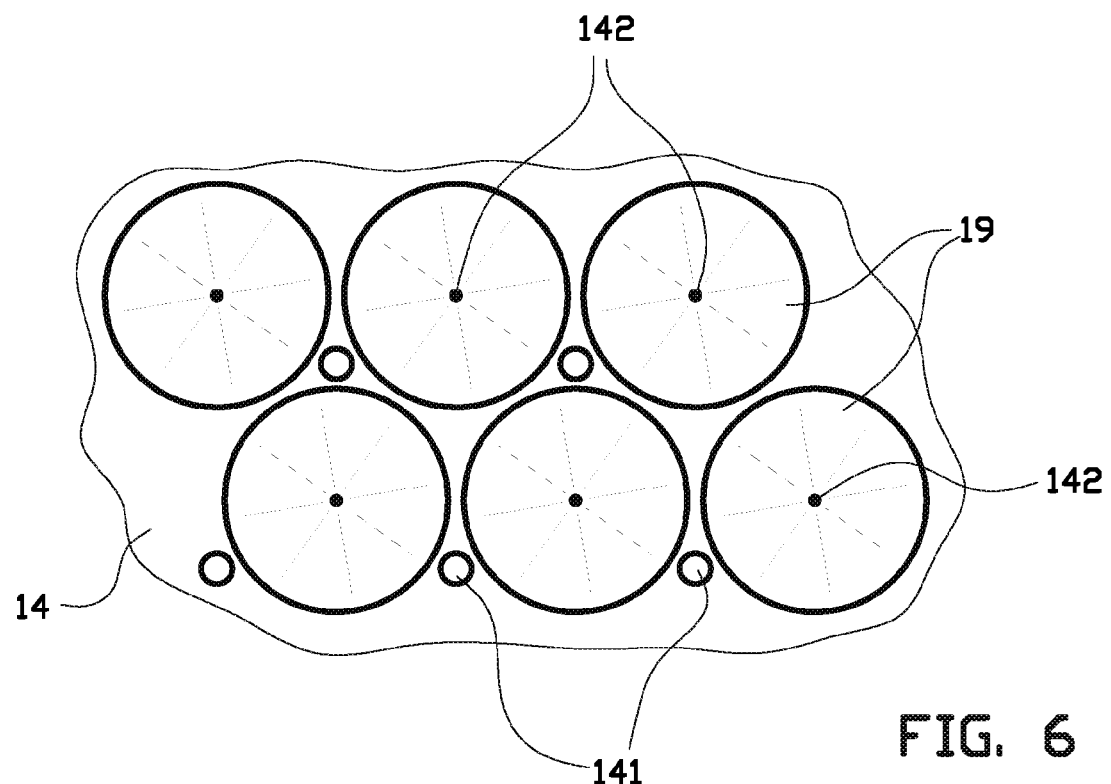
FIG. 6 is a schematic partial top view of the base plate of the substrate holding device of FIG. 5.

FIG. 5 is a schematic partial cross section of a fourth exemplary embodiment of a substrate holding device 11. FIG. 6 is a schematic partial top view of the base plate 14 of the substrate holding device of FIG. 5. In this fourth example, the base plate 14 is provided with an array of pockets 19, which are substantially shaped as a cone. For example, the descending slope of said cone may be approximately 15 degrees. The droplets 18 are arranged in said pockets 19 and are arranged to bridge the gap between the base plate 14 and the holding plate 12. The cone shape of the pockets 91 will substantially fix the position of the liquid and/or solid droplets 18 of heat absorbing material. In addition the cone shape of the pockets 19 and the surface tension of the heat absorbing material in the liquid phase provides a force to keep the liquid droplets 18 substantially in the center of the pockets 19. No other parts are required to fix the location of the droplets 18.

Also in this fourth example, the base plate 14 is provided with an array of holes 141 and each support 17 of a series of supports is on one side arranged in one of said holes 141 and is fixed in said hole 141 via a glue connection. The other side of the supports 17 is fixed to the holding plate 12.

In addition, the base plate 14 may be provided with venting holes 142 which debouche substantially in the center of the pockets 19. The venting holes 142 are arranged to prevent the inclusion of air underneath the droplets 18.

Figure 7:
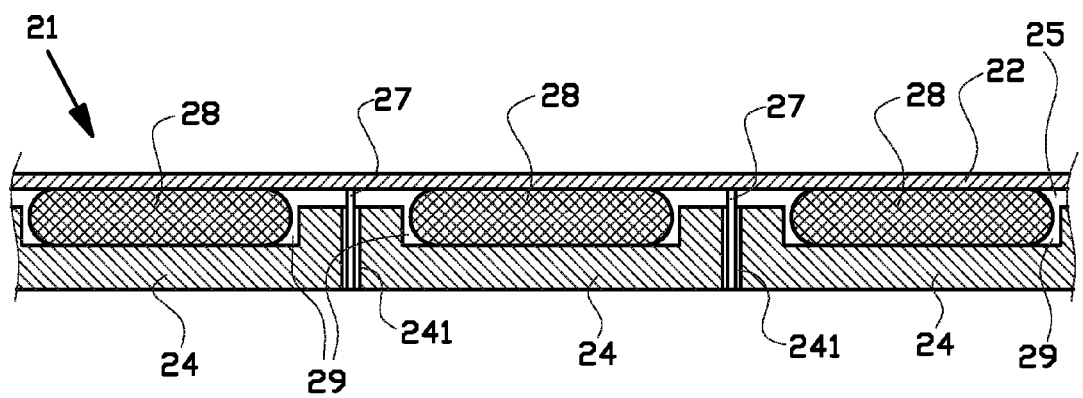
FIG. 7 is a schematic partial cross section of a fifth exemplary embodiment of a substrate holding device.

FIG. 7 is a schematic partial cross section of a fifth exemplary embodiment of a substrate holding device 21. In this fifth example, the base plate 24 is provided with an array of pockets 29, which are substantially shaped as a straight cylinder with a substantially circular bottom area. The droplets 28 are arranged in the pockets 29 and contact both circular bottom area of the pockets 29 in the base plate 24 and the holding plate 22. In order to allow the droplets 28 to expand at least in a direction along the gap 25, the volume of the droplets 28 is arranged such that the diameter of the droplets 28 in a direction parallel to the bottom area of the pockets 29, is smaller than the diameter of the cylindrical pockets 29. The cylindrical pockets 29 will substantially establish the position of the droplets 28 of heat absorbing material, both in the solid and in the liquid phase. No other parts are required to substantially fix the location of the droplets 28. An advantage of this example is, that the surface of the base plate 24 where no pocket 29 is arranged can be arranged close to the holding plate 22. Thus the holding plate 22 can be connected to the base plate 24 with very short supports 27, or even with no supports at all, which yields a very rigid substrate holding device 21.

Figure 8:
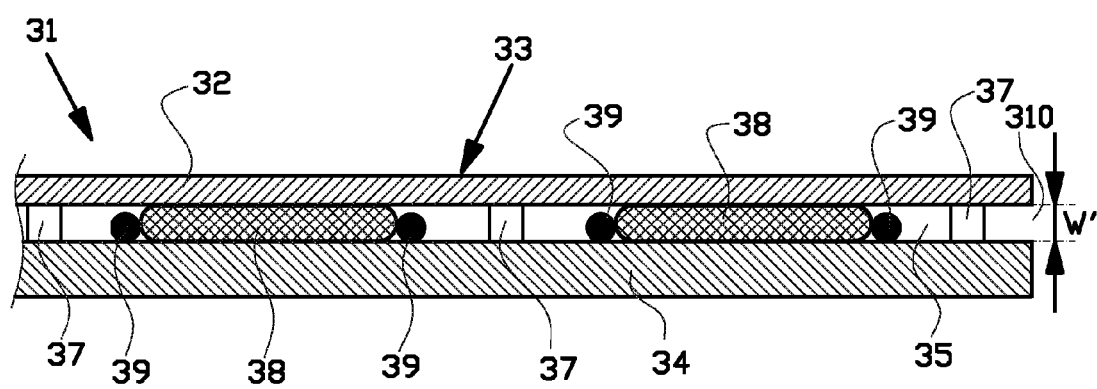
FIG. 8 is a schematic partial cross section of a sixth exemplary embodiment of a substrate holding device.

In the sixth example of a substrate holding device 31, as schematically shown in FIG. 8, the droplets 38 are arranged inside an O-ring 39 which is made from a flexible or elastic material, such as rubber, for example Viton®. Each one of said droplets 38 is arranged inside an O-ring 39, which provides a lateral containment of the droplets 38 and allows contraction and expansion of said droplets 38 in a direction along the gap 35 due to the flexible or elastic material of said O-ring 39.

Preferably the thickness of the O-rings 39 is less than the width w' of the gap 35 between the holding plate 32 and the base plate 34. This allows to assemble the substrate holding device 31 comprising the holding plate 32, the base plate 34 and the supports 37 and to obtain a gap 35 with the required width w' without interference of the O-rings 39. It is avoided that the O-rings 39 contact both the holding plate 32 and the base plate 34 or are compressed in between the holding plate 32 and the base plate 34, since this may have a negative influence on the flatness of the first side 33 of the holding plate 32.

As indicated in FIG. 8, the gap 35 is substantially open at a surrounding side edge 310 of the substrate holding device 31. The gap 35 may even be substantially open along substantially the complete surrounding side edge 310 of the substrate holding device 31. Thus the gap 35 comprises an open connection to the outside of the substrate holding device 31. The air pressure or vacuum pressure inside the gap 35 is substantially equal to the air pressure or vacuum pressure outside the substrate holding device 31.

Figure 9A:
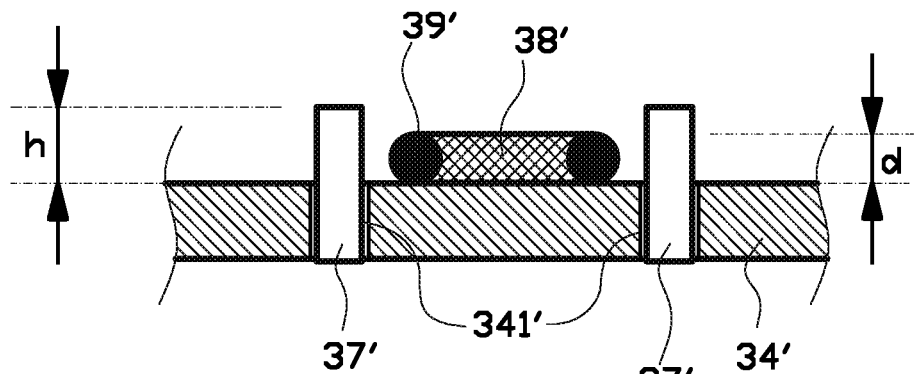
FIGS. 9A, 9B and 9C schematically show steps of an alternative method for manufacturing a substrate holding device according to the sixth embodiment as shown in FIG. 8.
Figure 9B:
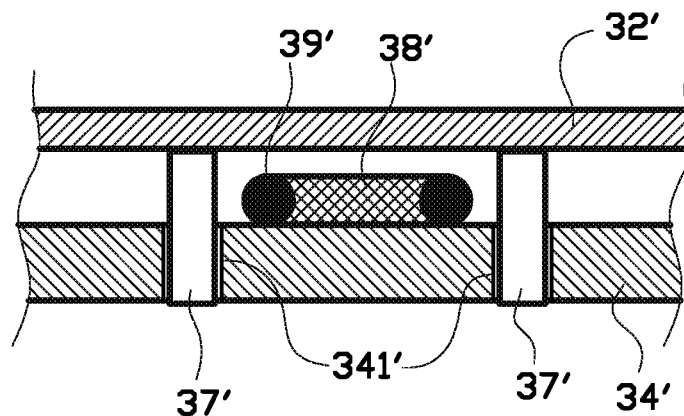
Figure 9C:
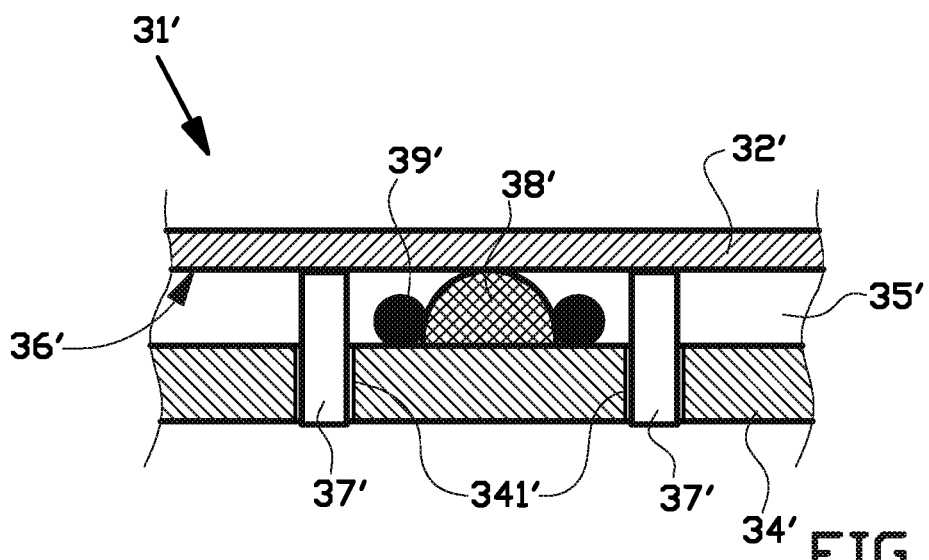

In FIGS. 9A, 9B and 9C schematically show steps of a method for building a substrate holding device 31' according to the embodiment of FIG. 8, with this difference that in this example the supports 37' are arranged in an array of holes 341' of the base plate 34'.

First a base plate 34' comprising an array of holes 341' is provided. A series of supports 37' are provided and each support 37' of said series of supports is arranged in one of said holes 341' and is fixed in said hole 341', preferably via a glue connection.

Subsequently, assemblies of O-rings 39' with a solid pill or droplet 38' of heat absorbing material inside, are arranged in between the supports 37', as schematically shown in FIG. 9A. It is noted that the thickness d of the assemblies 38', 39' is less than the height h of which the supports 37' project out of the base plate 34'.

Next, the holding plate 32' is arranged on top of the supports 37' and is fixed to said supports 37', preferably via a glue connection. As schematically indicated in FIG. 9B, the holding plate 32' is arranged on top of the supports 37' with a gap above the assembly of O-ring 39' and solid droplet 38' of heat absorbing material.

Subsequently the solid droplet 38' of heat absorbing material is melted, for example by arranging the assembly in an oven at a temperature above the melting temperature. Due to the surface tension in the liquid droplet 38' of heat absorbing material, the liquid droplet 38' will assume a more spherical shape, as schematically indicated in FIG. 9C, and contacts the second side 36' of the holding plate 32'. The droplets 38' are now arranged to bridge the gap 35 between the base plate 34' and the holding plate 32'.

Next the assembled substrate holding device 31' is arranged in a 'cold' environment at a temperature below the freezing temperature of the heat absorbing material, and the liquid droplets 38' will solidify, substantially in the shape as shown in FIG. 9C. Thus the solid droplets 38' fill the gap 35' and contact both the base plate 34' and the holding plate 32'. Now the substrate holding device 31' is ready for use.

Figure 10:
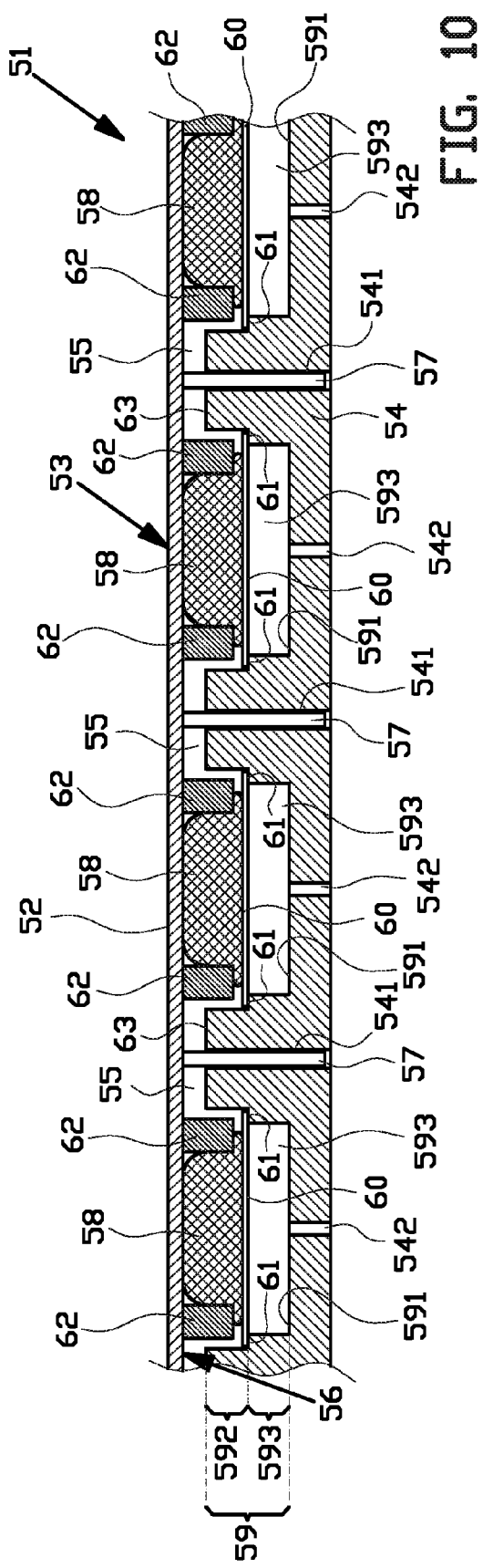
FIG. 10 is a schematic partial cross section of a seventh exemplary embodiment of a substrate holding device.

FIG. 10 is a schematic partial cross section of a seventh exemplary embodiment of a substrate holding device 51. In this seventh example, the base plate 54 is provided with an array of pockets 59, which are substantially shaped as a straight cylinder with a substantially circular bottom surface 591. The pocket 59 comprises a first or upper pocket part 592 with a first diameter, and a second or lower pocket part 593 with a second diameter which is smaller than the first diameter. The second pocket part 593 is arranged substantially centrally in the first pocket part 592. This yields a rim or step 61 arranged inside said pocket 59, which extends along the circumferential sidewall of said pocket 59. Each pocket 59 of said array of pockets comprises an elastic member, in particular an elastic cover plate 60, which spans said pocket 59 and is arranged spaced apart from a bottom surface 591 of said pocket 59. The elastic cover plate 60 has a diameter which is smaller than the first diameter, but larger than the second diameter. Accordingly, the circumferential edge of the elastic cover plate 60 rests on top of said rim or step 61. The elastic cover plate 60 provides a means for taking up any residual expansion in the direction substantially perpendicular to the gap 55, by a bending or flexing of at least the central part of the cover plate 60 towards the bottom surface 591 of the pocket 59. Preferably, the elastic cover plate 60 is a Titanium plate.

Each pocket 59 comprises a droplet 58 from said array of droplets, which droplet 58 is arranged between said elastic cover plate 60 and the second side 56 of the holding plate 52. The droplet 58 of a PCM is substantially centrally arranged on top of the elastic cover plate 60.

As shown schematically in FIG. 10, the cover plate 60 is arranged inside the corresponding pocket 59, below the surface 63 of the base plate 54 surrounding the pocket, which provides a means for fixing the location of the droplets 58 in the gap 55 between the base plate 54 and the holding plate 52. In order to increase the heat transport between the elastic holding plate 60 and the base plate 54, a heat conducting paste is preferably arranged between the circumferential edge of the elastic holding plate 60 and the rim or step 61.

In addition, each pocket 59 comprises a ring or a loop 62 which is arranged to surround a droplet 58 in said pocket 59. Preferably the ring is made from a synthetic material or a rubber material, such as Viton®. The ring or loop 62 is arranged in said pocket 59, preferably on top of said elastic cover plate 60, and acts as a confinement member for a droplet 58 of PCM in said pocket 59. The thickness of said ring or loop 62 is less than the distance between the holding plate 52 and the elastic cover plate 60. Accordingly, the ring or loop 62 is not in direct contact with both the cover plate 60 and the holding plate 52. The ring or loop 62 comprises a substantially rectangular cross-section in a direction substantially perpendicular the first side 53 of the holding plate 52. A substantially flat upper surface of said ring or loop 62 is arranged facing the second side 56 of the holding plate 52. When using a PCM with a high density, such as metallic-like materials having a Gallium-like substance behavior, the ring or loop 62 is pushed upwards by the PCM, which will push the ring or loop 62 towards the second side 56 of the holding plate 52. The flat upper surface of the ring or loop 62 is pushed against the second side 56 of the holding plate 52 and provides a seal for containing the PCM inside the ring or loop 62.

In the example shown in FIG. 10, the base plate 54 is provided with venting holes 542 which debouche in a bottom surface 591 of said pockets 59, preferably in the center of said pockets 59. Due to the venting holes 591, the pressure inside the lower part 593 of the pockets 59 between the bottom surface 591 and the elastic cover plate 60 is substantially equal to the pressure which surrounds the substrate holding device 51.

Also in this seventh example, the base plate 54 is provided with an array of holes 541, and the holding plate 52 is provided with an array of supports 57. Each support 57 is arranged in a corresponding one of said holes 541 and is fixed in said hole 541 via a glue connection.

It is noted that the above presented examples all describe a substrate holding device which, according to the present invention, is suitable for holding an array of droplets of a heat absorbing material, preferably a Phase Change Material (PCM), more preferably a metallic like PCM. Examples of such materials are presented in the table below:

| Metal Alloys | Melting Temperature | |
| --- | --- | --- |
| | ° F. | ° C. |
| 44.7 Bi/22.6 Pb/19.1 In/8.3 Sn/5.3 Cd | 117 Eut. | 47 Eut. |
| 49.3 Bi/20.8 In/17.9 Pb/11.5 Sn/.5 Cd | 129-133 | 54-56 |
| 47.5 Bi/25.4 Pb/12.6 Sn . 9.5 Cd/5 In | 134-149 | 57-65 |
| 49 Bi/21 In/18 Pb/12 Sn | 136 Eut. | 58 Eut. |
| 49 Bi/18 Pb/18 In/15 Sn | 136-156 | 58-69 |
| 48 Bi/25.6 Pb/12.7 Sn/9.6 Cd/4 In | 142-149 | 61-65 |
| 61.72 In/30.78 Bi/7.5 Cd | 143 Eut. | 61.5 Eut. |
| 52 Bi/26 Pb/22 In | 156-158 | 68-69 |

-continued

| Metal Alloys | Melting Temperature | |
|---|---|---|
| | ° F. | ° C. |
| 50 Bi/27 Pb/13 Sn/10 Cd | 158 Eut. | 70 Eut. |
| 50.5 Bi/27.8 Pb/12.4 Sn/9.3 Cd | 158-165 | 70-73 |
| 50 Bi/34.5 Pb/9.3 Sn/6.2 Cd | 158-173 | 70-78 |
| 42 Bi/35 Pb/13 Sn/10 Cd | 158-176 | 70-80 |
| 41 Bi/36 Pb/13 Sn/10 Cd | 158-185 | 70-85 |
| 42.5 Bi/37.7 Pb/12 Sn/5.1 Cd | 158-194 | 70-90 |
| 46 Pb/30.7 Bi/18.2 Sn/5.1 Cd | 158-253 | 70-123 |
| 42 Bi/37 Pb/12 Sn/9 Cd | 160-190 | 71-88 |
| 66.3 In/33.7 Bi | 162 Eut. | 72 Eut. |
| 40 Bi/33.4 Pb/13.3 Sn/13.3 Cd | 162-235 | 72-113 |
| 50 Bi/39 Pb/7 Cd/4 Sn | 165-200 | 73-93 |
| 50 Bi/39 Pb/8 Cd/3 Sn | 170-180 | 77-82 |
| 48.5 Bi/41.5 In/10 Cd | 171 Eut. | 77.5 Eut. |
| 54.1 Bi/29.6 In/16.3 Sn | 178 Eut. | 81 Eut. |
| 50.4 Bi/39.2 Pb/8 Cd/1.4 In/1 Sn | 178-185 | 81-85 |
| 52 Bi/31.6 Pb/15.4 Sn/1 Cd | 181-198 | 83-92 |
| 51.08 Bi/39.8 Pb/8.12 Cd/1 In | 188-196 | 87-91 |
| 51.45 Bi/31.35 Pb/15.2 Sn/2 In | 190-200 | 87-93 |
| 46.7 Bi/39.3 Pb/12.4 Sn/1.6 In | 190-230 | 88-110 |
| 51.6 Bi/40.2 Pb/8.2 Cd | 197 Eut. | 92 Eut. |
| 44 In/42 Sn/14 Cd | 200 Eut. | 93 Eut. |
| 50 Bi/31 Pb/19 Sn | 200-210 | 93-99 |
| 52 Bi/30 Pb/18 Sn | 220 Eut. | 95 Eut. |
| 50 Bi/28 Pb/22 Sn | 202-225 | 95-108 |

* Eutectic (Eut.) - When a alloy melts at a single point, like pure metals.

Figure 11:
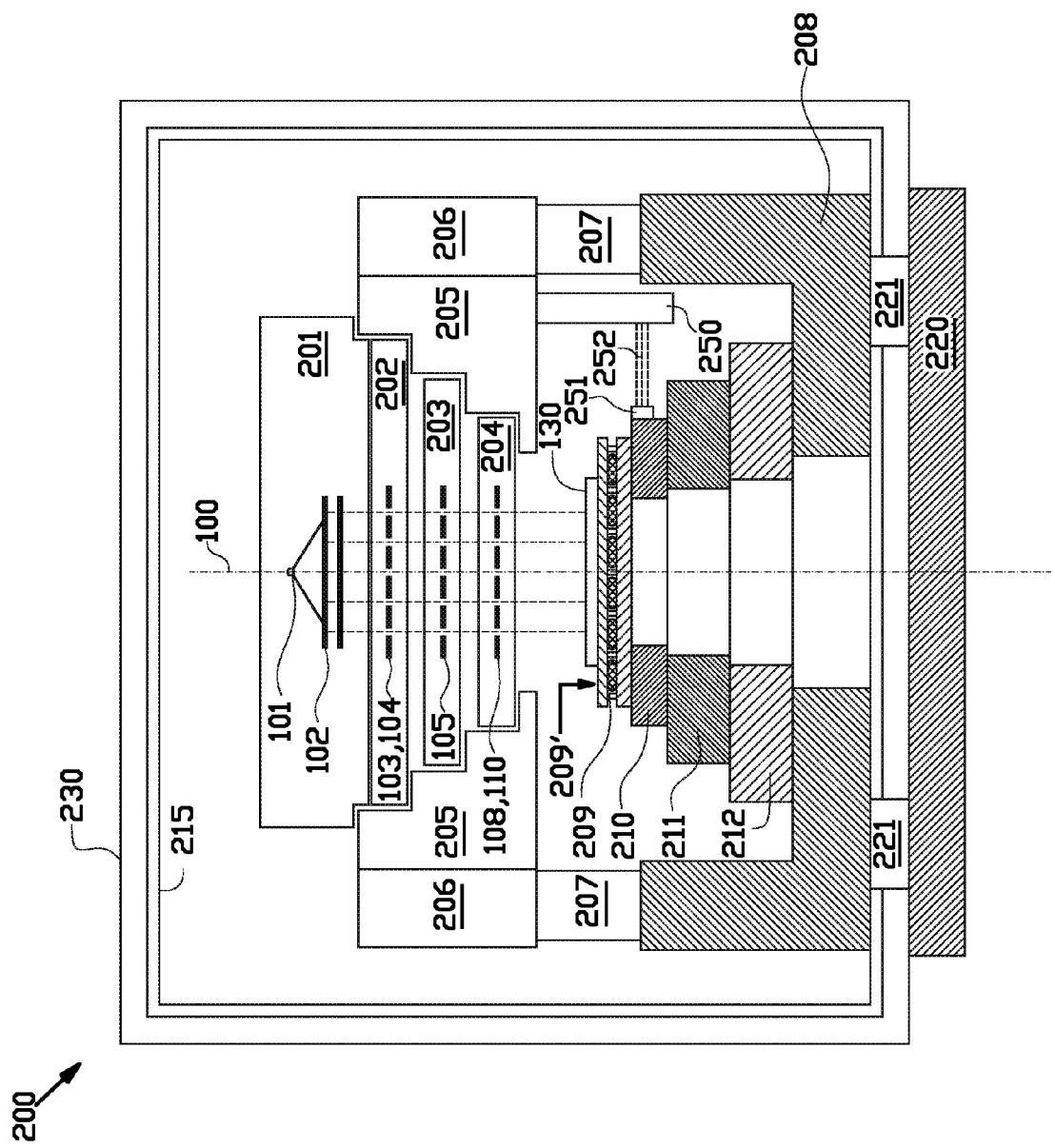
FIG. 11 schematically shows an apparatus for processing or imaging a sample, wherein said apparatus comprises a substrate holding device of the invention.

FIG. 11 shows a simplified diagram of an apparatus for processing or imaging a sample 130. Said apparatus comprises a module 201 comprising a source for electromagnetic radiation or particles having energy, a module 204 comprising an exposing unit for exposing said sample 103 to said electromagnetic radiation or particles having energy, and a substrate holding device 209 according to the invention.

In particular, FIG. 11 schematically represents a multi-beam charged particle lithography system, comprising:
an illumination optics module 201 including the charged particle beam source 101 and beam collimating system 102,
an aperture array and condenser lens module 202 including aperture array 103 and condenser lens array 104,
a beam switching module 203 including beam blanker array 105, and
projection optics module 204 including beam stop array 108, beam deflector array 109, and projection lens arrays 110.

In the example shown in FIG. 11, the modules are arranged in an alignment inner sub-frame 205 and an alignment outer sub frame 206. A frame 208 supports the alignment sub-frames 205 and 206 via vibration damping mounts 207.

The modules 201, 202, 203, 204 together form a charged particle optical unit for generating multiple charged particle beams, modulating said charged particle beams, and directing said charged particle beams towards the first side 209' of a substrate holding device 209.

The substrate holding device 209 is arranged on top of a chuck 201. On the first side 209' of the substrate holding device 209, a target, for example a wafer 130, can be arranged.

The substrate holding device 209 and chuck 210 are arranged on a short stroke stage 211 which is arranged for driving said chuck 210 over a small distance along all six degrees of freedom. The short stroke stage 211 is mounted on top of a long stroke stage 212 which is arranged for driving said short stroke stage 211 and the chuck 210 along two orthogonal directions (X and Y) in an at least substantially horizontal plane.

The lithography apparatus 200 is arranged inside a vacuum chamber 400, which includes a mu metal (μ metal) shielding layer or layers 215. The shielding 215 is in a convenient manner arranged as a lining of the vacuum chamber 400. The machine rests on a base plate 220 supported by frame members 221.

The position of the wafer 130 and substrate holding device 209 with respect to the charged particle optical unit 201, 202, 203, 204 is measured with a measuring device 250 which is attached to the alignment sub-frame 205, which measuring device 250 monitors the position of the chuck 210 with respect to the measuring device 250. The measuring device 250 comprises, for example, an interferometer system and the chuck 210 is then provided with a mirror 251 for reflecting the light beams 252 from the interferometer system.

Figure 12:
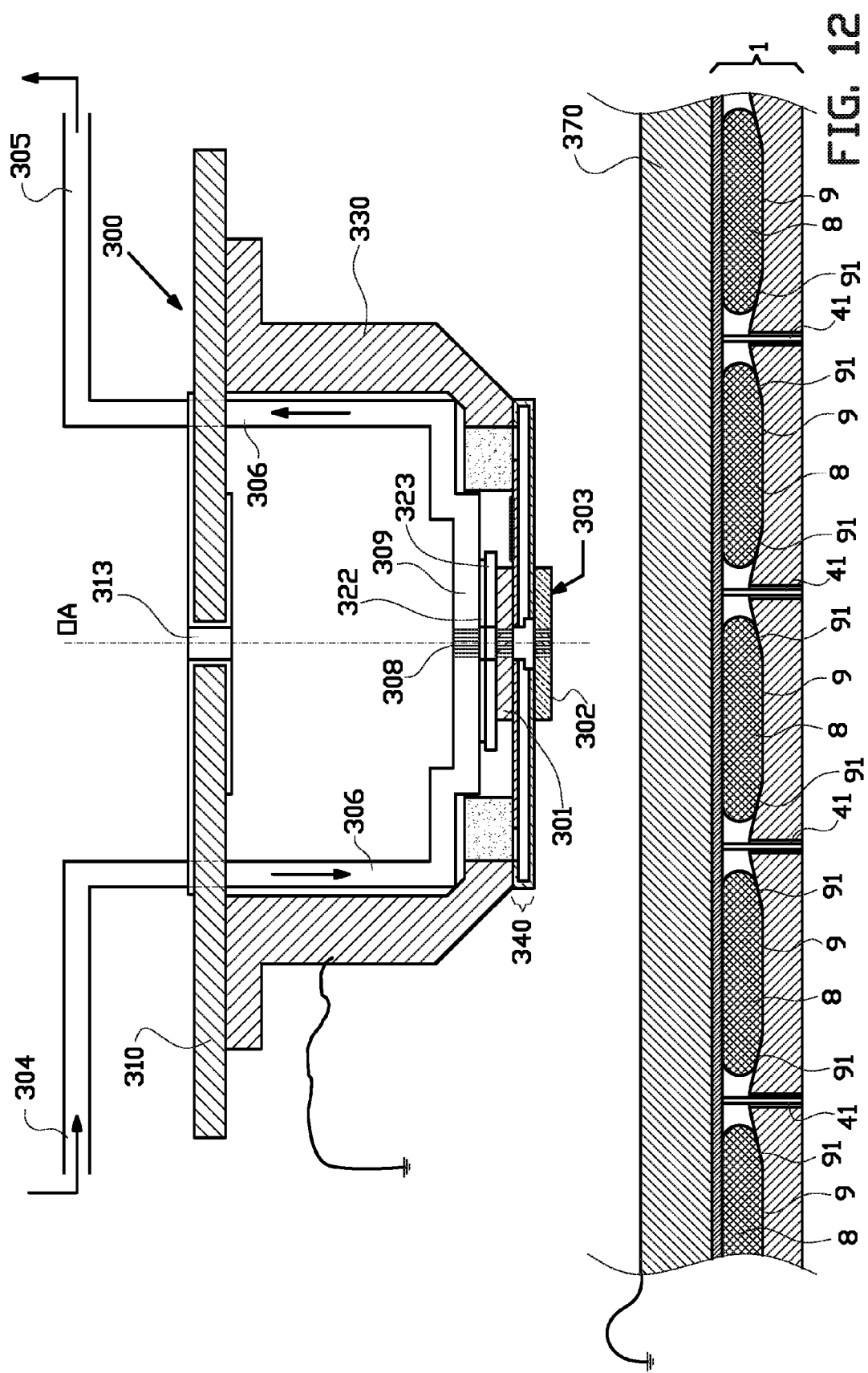
FIG. 12 schematically shows a cross section of an embodiment of a projection lens system assembly, for example for use in the apparatus as schematically shown in FIG. 11.

FIG. 12 shows a cross sectional view of an embodiment of an improved projection lens assembly 300, for example for use in the projection optics module 204 of the multi-beam charged particle lithography system of FIG. 11. The projection lens assembly 300 comprises a housing having an electrically conductive circumferential wall 330, preferably made from a metal. The projection lens assembly 300 further comprises a cover element 310, and a support element 340 at the downstream end of said housing. A passage for charged particle beams extends from the through opening 313 in the cover element 310, through the interior of the projection lens assembly towards the first electrode 301, through the support element 340 and finally debouches in second electrode 302. A multitude of charged particle beams may traverse said through-opening before impinging on a target 370 arranged on top of a substrate holding device, preferably but not necessary a substrate holding device 1 as described in the examples one to six above. In the embodiment shown, the support element 340 extends substantially parallel to both the first and the second electrode 301, 302. Preferably, the support element 340 extends radially away from the lens-hole arrays in first and second electrodes 301, 302.

To avoid formation of electrical fields between the target 370 and the projection lens assembly 300, both may be connected to ground and/or conductively connected to each other. A structurally robust projection lens assembly according to the invention may be placed integrally in a known lithography system or may be swapped out or removed for maintenance purposes.

The multitude of charged particle beams first passes through the through passage 313 in the cover element 310. Once the charged particle beams have traversed the through opening 313 they arrive at the beam stop array 308. The beam stop array 308 is arranged to block charged particle beams which have been deflected by the beam blanker array 105 of the beam switching module 203. The charged particle beams which are deflected by the beam blanker array 105 (see for example FIG. 11) are blocked by the beam stop array 308 and do not reach the target 370. Accordingly the charged particle beams can be individually modulated by the beam blanker array to allow the individual charged particle beams to impinge on the target 370 or not. The beams that are not deflected by the beam blanker array travel through the beam stop array 308 and are projected onto the surface of the target 370 by electrostatic lenses provided by the first and second electrodes 301, 302. Using this modulation and a relative movement of the target 370 with respect to the exposing unit comprising the projection lens assembly 300, allows the writing of a pattern onto the surface of the target 370.

In some projection lens systems, a deflector unit is arranged between the beam stop array 308 and the first and second electrodes 301, 302, which deflector unit is arranged to provide a scanning deflection of the beams that have passed the beam stop array 308 over de surface of the sample 307. Preferably, the deflector unit comprises an X- and a Y-deflector to deflect the beams in orthogonal directions perpendicular to the optical axis OA of the projection lens system 300.

Figure 13:
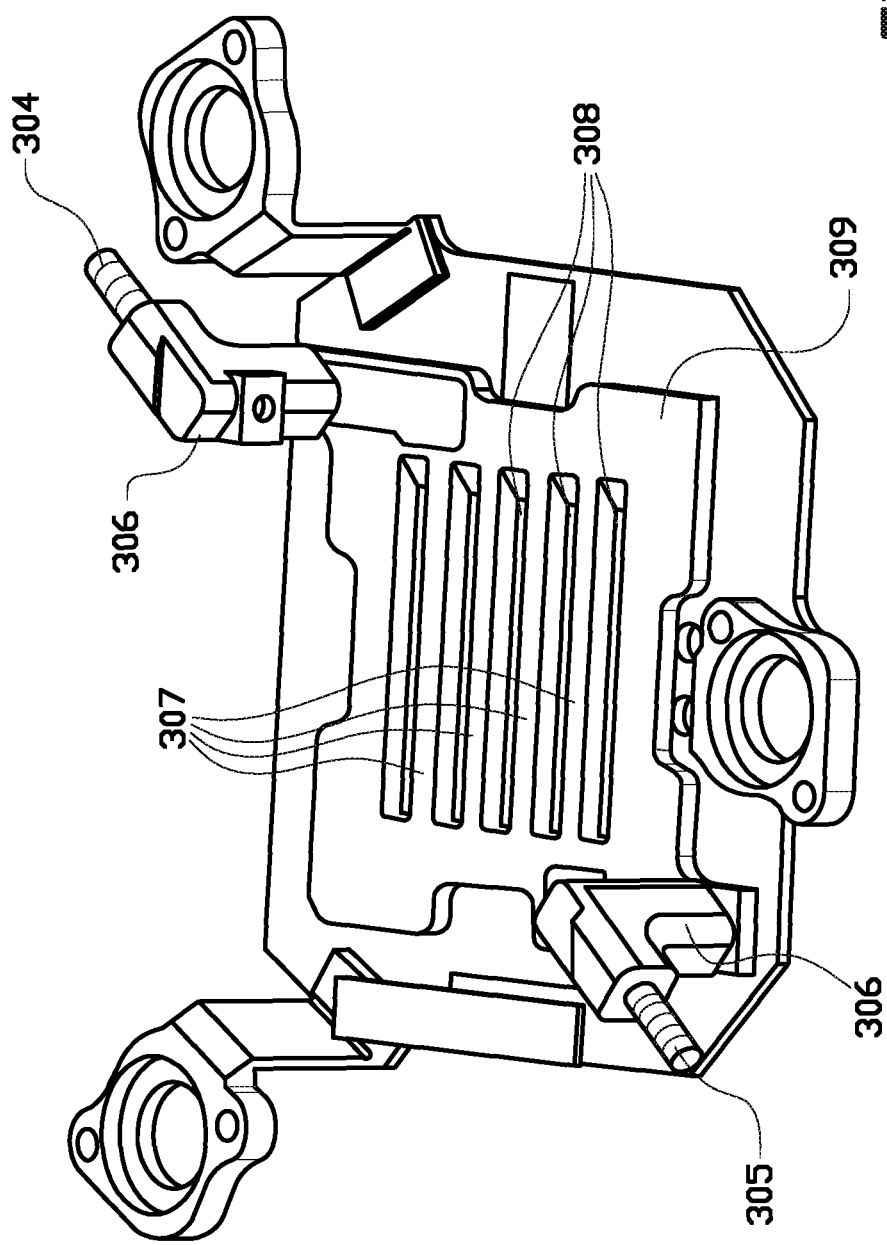
FIG. 13 schematically shows a cooling device for use in a projection lens system as schematically shown in FIG. 12.

As indicated above, the beam stop array 308 is a component for at least partially and/or temporally blocking at least part of the charged particles of the multiple charged particle beams. In order to remove the heat generated by the blocking of the charged particle beams, the beam stop array 308 component is provided with conduits 309. In use, a cooling fluid is guided through the conduits 309, wherein the conduits 309 are arranged in thermal contact with the beam stop array 308. At least a first part 307 of the conduits is arranged an area between two charged particle beams, as schematically indicated in FIG. 13. The central axis of said first part 307 of the conduits extend in a direction substantially perpendicular to a central axis or optical axis OA of the projection lens system 300.

As indicated in FIGS. 12 and 13, at least a second part 306 of the conduits is arranged to extend so that a central axis of said second part 306 of the conduits extend in a direction substantially parallel to a central axis or optical axis OA of the projection lens system 300. Accordingly, the first part 307 of the conduits can be arranged at or near a first end 303 of the projection lens system 300 that, in use, is arranged close to the substrate 370. The second part 306 of the conduits provide an extension of the conduits away form said first end 303 of the projection lens system 300, which allows to provide an input connection 304 and/or an output connection 305 for the fluid suitably spaced apart from the first end 303, and to arranged the first end 303 of the projection lens system 300 very close to the substrate 370.

It is noted that a cooling unit as shown in FIG. 13, can also be used for cooling active components for at least partially or temporally manipulating charged particle beams, such as but not limited to electrostatic deflectors or lenses, to move heat generated by the electronic components arranged on or in such active components. The active components, for example the first and second electrodes 301, 302, can be arranged in between the conduits 307.

Figure 14:
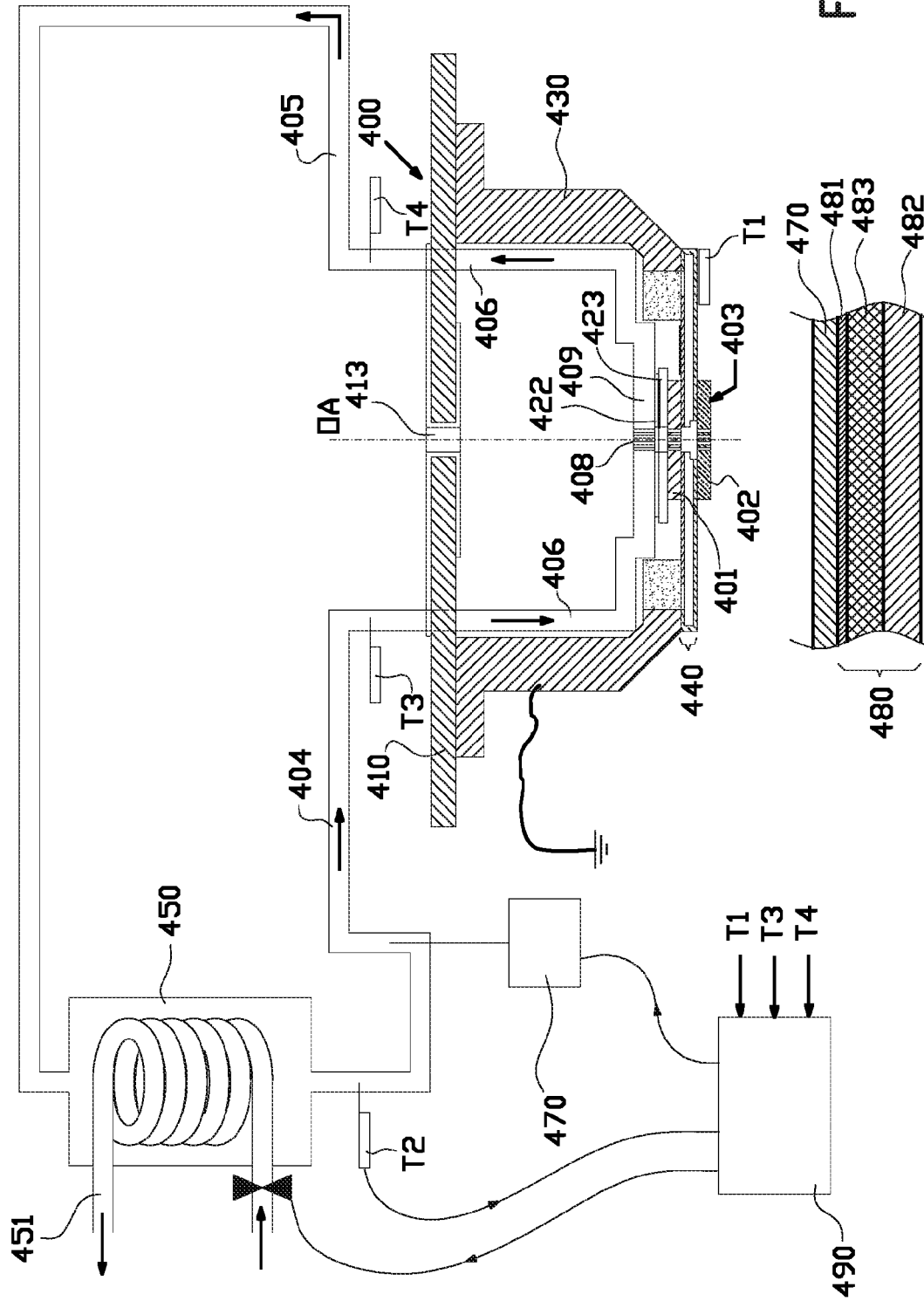
FIG. 14 schematically shows a part of an apparatus comprising a projection lens system comprising a cooling arrangement, and a substrate holding device comprising a temperature stabilizing arrangement.

FIG. 14 shows a cross sectional view of an embodiment of a part of an assembly comprising an exposing unit for exposing a sample 470, and a substrate holding device 480 for holding said sample 470 at least during said exposing. The assembly shown in FIG. 14 is suitable, for example, for use in the projection optics module 204 of the multi-beam charged particle lithography system of FIG. 11.

The exposing unit comprises projection lens assembly 400 comprises a housing having an electrically conductive circumferential wall 430, preferably made from a metal. Just as the projection lens assembly 300 shown in FIG. 12, the projection lens assembly 400 comprises a cover element 410, a through opening 413 in the cover element 410, a beam stop array 408, a support element 440, a first electrode 401, a second electrode 402.

In addition the projection lens assembly 400 comprises components for at least partially and/or temporally manipulating and/or blocking at least part of the charged particle beams. One such component is the beam stop array 408, which is arranged to block charged particle beams which have been deflected by the beam blanker array 105 of the beam switching module 203 shown in FIG. 11. The beam stop array 408 comprises a cooling arrangement which is arranged for substantially maintaining the beam stop array 408 at a predetermined first temperature. In the example shown in FIG. 14, the cooling arrangement also cools the other parts of the projection lens assembly, and in use, substantially the whole projection lens assembly is at said first temperature. The projection lens assembly comprises a first temperature sensor T1, which is arranged at the support element 440, for example, which first temperature sensor T1 is arranged for measuring the temperature of the projection lens assembly, in particular the part of said projection lens assembly facing the substrate holding device 480.

The cooling arrangement comprises a substantially closed circuit of conduits or ducts for a cooling fluid, in particular a cooling liquid, such as highly pure water. The cooling arrangement further comprises a cooling device 450 for cooling the cooling fluid to a temperature below the first temperature. The cooling device 450 comprises a heat exchange circuit 451 which, in use, is coupled to a Fab coolant circuit.

Downstream of the cooling device 450, a heating device 470 is arranged in the closed circuit. The heating device 470 is arranged for heating the cooling liquid. The combination of the cooling device 450 and heating device 470 provides a means for accurately controlling the temperature of the cooling fluid. The heating device is arranged in the conduits at an upstream position with respect to the projection lens assembly 400.

As indicated above, the beam stop array 408 is a component for at least partially and/or temporally blocking at least part of the charged particles of the multiple charged particle beams. In order to remove the heat generated by the blocking of the charged particle beams, the beam stop array 408 component is provided with conduits 409 which are part of the cooling arrangement. In use, the cooling fluid coming from the cooling device 450 and from the heating device 470 is arranged to flow through the conduits 406 towards the conduits 409, wherein the conduits 409 are arranged in thermal contact with the beam stop array 408. Subsequently the cooling fluid flows back to the cooling device 450 via the conduits 406', 405. As indicated in FIG. 14, the conduits 409 are arranged inside the projection lens system 400 at or near a first end 403 of the projection lens system 400 that, in use, is arranged close to the substrate 470.

Furthermore, the closed circuit comprises one or more temperature sensors for measuring the temperature of the cooling fluid in the conduits 404, 406, 409, 406', 405. In the particular example shown in FIG. 14:

a second temperature sensor T2 is arranged in the conduits between the cooling device 450 and the heating device 470;

a third temperature sensor T3 is arranged in the conduits between the heating device 470 and the beam stop array 408; and a fourth temperature sensor T4 is arranged in the conduits downstream of the beam stop array 408.

The temperature sensors T1, T2, T3 and T4 provide an input for a temperature control system 490 which is arranged to control the flow of Fab cooling liquid through the heat exchange circuit 451 in the cooling device 450 and/or to control the heating of the cooling fluid by the heating device 470. The temperature control system 490 is arranged to control the heating device 470 and/or the cooling device 450 to establish a temperature difference between the substrate holding device 480 and the projection lens system 400, in particular the first end 403 of the projection lens system 400 which faces the substrate holding device 480, which temperature difference is preferably in a range of 1° C. to 1.5° C.

The sample 470 is arranged on top of a substrate holding device 480 for holding said sample 470 at least during an exposure. The substrate holding device 480 comprises a holding plate 481, wherein the holding plate comprises a first side for holding a substrate 470, and a base plate 482. In between the holding plate 481 and the base plate 482, a temperature stabilizing arrangement is arranged which comprises a phase change material 483 having a phase change at a second temperature. The substrate holding device 480 is preferably, but not necessary, a substrate holding device as described in the examples one to six above.

In the example shown in FIG. 14, both the substrate holding device 480 and the projection lens system 400 are each provided with an arrangement for controlling its temperature. In particular, since the projection lens system 400 is arranged to expose a sample 470 using charged particle beams having energy, the projection lens system 400, in particular the beam stop array 408 and/or the sample 470 will absorb at least part of the energy. By providing both the projection lens system 400 and the substrate holding device 480 with their own cooling arrangement and temperature stabilizing arrangement, an accurate temperature control of the substrate 470 can be obtained, which temperature control allows to:

at least substantially maintain the temperature of the projection lens system 400, in particular the beam stop array 408 thereof, at the first temperature, preferably using the readily available Fab coolant, and to maintain the temperature of the substrate 470 at the second temperature using a phase change material having a phase change at a second temperature.

Preferably, the cooling arrangement and the temperature stabilizing arrangement are arranged such that the second temperature is at or near the first temperature, at least during an exposure of said substrate by said charged particle beams.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

For example, although the shape and diameter of the pockets in the above described examples are substantially the same for all pockets shown, the base plate can also be provided with pockets with different sizes and/or with different shapes. In particular the pockets along an edge of the substrate holding device may be smaller than the pockets to obtain a better coverage of heat absorbing material along the edge of the substrate holding device.

Furthermore, a large number of heat absorbing materials can be used. As already indicated, the heat absorbing material is preferably selected in order to have a melting temperature or a melting range at or near an operating temperature of the substrate processing apparatus in which the substrate holding device is used. Such heat absorbing materials are also known under the name of Phase Change Materials, or PCM in short.

In summary, the present invention relates to a substrate holding device comprising a holding plate, a base plate, an array of supports, and an array of droplets of a heat absorbing material. The holding plate comprises a first side for holding a substrate. The base plate is arranged at a distance from the holding plate and provides a gap between the base plate and the holding plate at a side of the holding plate opposite to the first side. The array of supports is arranged in between the holding plate and the base plate. The array of liquid and/or solid droplets is arranged in between the holding plate and the base plate, and the droplets are arranged to contact both the base plate and the holding plate. The droplets are arranged spaced apart from each other and from the supports, and are arranged adjacent to each other in a direction along the gap.

In addition or alternatively, the invention relates to an apparatus and method for exposing a sample. The apparatus comprises a source for electromagnetic radiation or particles having energy, an exposing unit for exposing said sample to said electromagnetic radiation or particles, and a substrate holding device for holding said sample at least during said exposing. The exposing unit comprises a component for manipulating and/or blocking at least part of the electromagnetic radiation or charged particles. The component comprises a cooling arrangement which is arranged for substantially maintaining the component at a predetermined first temperature. The substrate holding device comprises a temperature stabilizing arrangement which is arranged to substantially stabilize the temperature of a sample arranged on said substrate holding device. The temperature stabilizing arrangement comprises a phase change material having a phase change at a second temperature, which is at or near the first temperature.

The invention claimed is:

1. Substrate holding device, comprising:
   a holding plate, wherein the holding plate comprises a first side for holding a substrate,
   a base plate which is arranged at a distance from the holding plate and provides a gap between the base plate and the holding plate at a second side of the holding plate which faces away from the first side,
   an array of supports which are arranged at least in between the holding plate and the base plate, and
   an array of droplets of a heat absorbing material, which droplets are arranged in the gap between the holding plate and the base plate, wherein the droplets are arranged spaced apart from the supports and from other droplets of said array of droplets, and wherein the droplets are arranged to contact both the base plate and the holding plate.

2. Substrate holding device according to claim 1, wherein the droplets are arranged to enable a substantial free expansion of said droplets in the direction along the gap.

3. Substrate holding device according to claim 1, wherein the array of supports are fixedly attached to the second side of the holding plate.

4. Substrate holding device according to claim 1, wherein the array of supports are fixedly attached to the base plate.

5. Substrate holding device according to claim 4, wherein the base plate is provided with an array of holes, and wherein each support of said array of supports extends at least partially into one hole of said array of holes, preferably wherein the supports are fixedly arranged in said holes by providing a glue connection in a circumferential gap between the hole and the support extending into said hole.

6. Substrate holding device according to claim 1, wherein said substrate holding device further comprises an array of rings which are arranged in the gap between the holding plate and the base plate and wherein each ring of said array of rings is arranged to surround one droplet of said array of droplets.

7. Substrate holding device according to claim 6, wherein a thickness of said rings is less than the width of the gap between the holding plate and the base plate.

8. Substrate holding device according to claim 6, wherein the rings are made from a flexible or elastic material.

9. Substrate holding device according to claim 1, wherein a surface of the base plate facing the gap and/or a surface of the holding plate facing the gap is provided with an array of pockets, wherein the width of the gap between the holding plate and the base plate at a pocket of said array of pockets is larger than the width of the gap between the holding plate and the base plate around said pocket, and wherein each pocket of said array of pockets is arranged for holding on droplet of said array of droplets.

10. Substrate holding device according to claim 9, wherein at least one pocket of said array of pockets is substantially shaped as a cone, a conical frustum, a truncated sphere, or a spherical frustum.

11. Substrate holding device according to claim 1, wherein a surface of the base plate which faces the gap comprises an array of pockets, wherein each pocket of said array of pockets comprises an elastic member which span said pocket and is arranged spaced apart from a bottom surface of said pocket, and wherein each pocket comprises a droplet from said array of droplets, wherein said droplet is arranged between said elastic member plate and the holding plate.

12. Substrate holding device according to claim 11, wherein the distance between the elastic member and the holding plate is larger than the distance between the holding plate and the surface of the base plate adjacent to the pockets.

13. Substrate holding device according to claim 11, wherein the elastic member comprises a cover, preferably a cover plate.

14. Substrate holding device according to claim 11, wherein each pocket comprises a support element for supporting at least part of an edge of the elastic member, preferably a circumferential edge of the elastic cover, in said pocket.

15. Substrate holding device according to claim 14, wherein the support element comprises a rim or a step arranged in a circumferential sidewall of said pocket.

16. Substrate holding device according to claim 11, wherein each pocket comprises a ring or a loop which is arranged in the gap between the holding plate and the elastic member, and wherein the ring or the loop is arranged to surround a droplet in said pocket.

17. Substrate holding device according to claim 16, wherein a thickness of said ring or loop is less than the distance between the holding plate and the elastic member.

18. Substrate holding device according to claim 16, wherein the ring or loop is made from a flexible or elastic material.

19. Substrate holding device according to claim 16, wherein the ring or loop comprises a substantially rectangular cross-section.

20. Substrate holding device according to claim 9, wherein the base plate is provided with venting holes which debouche in a bottom surface of said pockets, and which preferably debouche substantially in the center of said pockets.

21. Substrate holding device according to claim 1 for use in a substrate processing apparatus or substrate imaging apparatus, wherein the droplets of said array of droplets comprises a material having a melting temperature or a melting range at or near an operating temperature of said substrate processing apparatus or substrate imaging apparatus.

22. Substrate holding device according claim 1, wherein the gap comprises an open connection to the outside of the substrate holding device, preferably the gap is substantially open at a surrounding side edge of the substrate holding device.

23. Substrate holding device, comprising:
a holding plate, wherein the holding plate comprises a first side for holding a substrate,
a base plate which is arranged at a distance from the holding plate and provides a gap between the base plate and the holding plate at a second side of the holding plate which faces away from the first side,
an array of supports which are arranged at least in between the holding plate and the base plate, and
an array of liquid or solid droplets of a heat absorbing material, which droplets are arranged in between the holding plate and the base plate, wherein the droplets are confined by the holding plate and the base plate in a direction substantially perpendicular to the first side of the holding plate, and wherein the droplets are arranged to enable an expansion of said droplets at least in a direction along the gap between the base plate and the holding plate.

24. Apparatus for processing or imaging a sample, wherein said apparatus comprises
a source for electromagnetic radiation or particles having energy,
an exposing unit for exposing said sample to said electromagnetic radiation or particles having energy, and
a substrate holding device according to claim 1 for holding said sample at least during said exposing.

25. Method for manufacturing a substrate holding device comprising a holding plate, wherein the holding plate comprises a first side for holding a substrate, a base plate which is arranged at a distance from the holding plate and provides a gap between the base plate and the holding plate at a second side of the holding plate which faces away from the first side, an array of supports which are arranged at least in between the holding plate and the base plate, and an array of droplets of a heat absorbing material, wherein the method comprises the steps of:
arranging the droplets spaced apart from the supports and from other droplets of said array of droplets in between the holding plate and the base plate, wherein the droplets at least in their liquid phase are arranged to contact both the holding plate and the base plate.

26. Method for assembling a substrate holding device, wherein the method comprises the steps of:
providing a holding plate, wherein the holding plate comprises a first side for holding a substrate, and an array of supports which are fixed to a second side of said holding plate facing away from the first side, wherein the supports are arranged to extend substantially perpendicular to the second side;
providing a base plate comprising an array of holes for mounting the supports therein;
arranging an array of droplets of a heat absorbing material spaced apart from the supports and from other droplets of said array of droplets on the holding plate at a side facing the base plate, or on the base plate at a side facing the holding plate;
moving the holding plate with the supports and the base plate towards each other until a desired distance between the holding plate and the base plate has been reached, wherein the supports are positioned in the holes, and the array of droplets are arranged in a gap between the holding plate and the base plate; and fixing one or more of said the supports in the corresponding hole.

27. Method according to claim 26, wherein the supports are fixed to said second side via glue connections.

28. Method according to claim 26, wherein the one or more supports are fixed in the corresponding holes via a glue connection, which glue connection is provided in a circumferential gap between the hole and the support extending into said hole.

29. A method for processing or imaging a sample, in an apparatus, comprising:
   holding the sample using the holding device according to claim 1; and
   processing or imaging the sample using the apparatus.

30. The method of claim 29, wherein the apparatus is a lithography system.

31. The method of claim 29, wherein the apparatus is a multi-beam charged particle lithography system.

* * * * *